United States Patent
Lee et al.

(10) Patent No.: US 8,232,565 B2
(45) Date of Patent: Jul. 31, 2012

(54) LIGHT EMITTING DIODE FOR AC OPERATION

(75) Inventors: Chung Hoon Lee, Ansan-si (KR); Dae Won Kim, Ansan-si (KR); Dae Sung Kal, Ansan-si (KR); Won Cheol Seo, Ansan-si (KR); Kyung Hee Ye, Ansan-si (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 312 days.

(21) Appl. No.: 12/607,644

(22) Filed: Oct. 28, 2009

(65) Prior Publication Data

US 2010/0102337 A1    Apr. 29, 2010

Related U.S. Application Data

(63) Continuation of application No. 12/607,506, filed on Oct. 28, 2009.

(30) Foreign Application Priority Data

| Oct. 29, 2008 | (KR) | 10-2008-0106510 |
| Jan. 7, 2009 | (KR) | 10-2009-0001045 |
| Oct. 5, 2009 | (KR) | 10-2009-0094314 |
| Oct. 16, 2009 | (KR) | 10-2009-0098721 |

(51) Int. Cl.
*H01L 33/00* (2010.01)
(52) U.S. Cl. ................. 257/88; 257/E33.066
(58) Field of Classification Search ............ 257/88, 257/79, 89, 99, 96; 315/193
See application file for complete search history.

(56) References Cited

U.S. PATENT DOCUMENTS 7,714,348 B2    5/2010 Fan et al.
(Continued)

FOREIGN PATENT DOCUMENTS

JP    2004-006582    1/2004
(Continued)

OTHER PUBLICATIONS

Notice of Allowance dated Apr. 16, 2012 for U.S. Appl. No. 12/607,506 issued.

*Primary Examiner* — Zandra Smith
*Assistant Examiner* — Lawrence Tynes, Jr.
(74) *Attorney, Agent, or Firm* — H.C. Park & Associates, PLC

(57) ABSTRACT

The present invention discloses a light emitting diode (LED) including a plurality of light emitting cells arranged on a substrate. The LED includes half-wave light emitting units each including at least one light emitting cell, each half-wave light emitting unit including first and second terminals respectively arranged at both ends thereof; and full-wave light emitting units each including at least one light emitting cell, each full-wave light emitting units including third and fourth terminals respectively formed at both ends thereof. The third terminal of each full-wave light emitting unit is electrically connected to the second terminals of two half-wave light emitting units, and the fourth terminal of each full-wave light emitting unit is electrically connected to the first terminals of other two half-wave light emitting units. Also, a first half-wave light emitting unit is connected in series between the third terminal of a first full-wave light emitting unit and the fourth terminal of a second full-wave light emitting units, and a second half-wave light emitting units is connected in series between the fourth terminal of the first full-wave light emitting unit and the third terminal of the second full-wave light emitting unit.

19 Claims, 19 Drawing Sheets

U.S. PATENT DOCUMENTS

| | | | |
|---|---|---|---|
| 7,768,020 B2 * | 8/2010 | Kim et al. ................... 257/88 |
| 7,804,098 B2 | 9/2010 | Lee et al. |
| 2005/0253151 A1 * | 11/2005 | Sakai et al. ................ 257/79 |
| 2008/0116816 A1 | 5/2008 | Neuman et al. |
| 2010/0006867 A1 * | 1/2010 | Lee et al. .................. 257/88 |
| 2010/0019253 A1 * | 1/2010 | Kim et al. ................... 257/88 |
| 2010/0148190 A1 * | 6/2010 | Kim et al. ................... 257/88 |

FOREIGN PATENT DOCUMENTS

| | | |
|---|---|---|
| JP | 2006-073815 | 3/2006 |
| KR | 10-0690323 | 2/2007 |
| KR | 10-2007-0064208 | 6/2007 |
| WO | WO2008/038918 * | 3/2008 |

* cited by examiner (a)

(b)

LIGHT EMITTING DIODE FOR AC OPERATION

CROSS REFERENCE TO RELATED APPLICATIONS

This application is a continuation of U.S. application Ser. No. 12/607,506 filed on Oct. 28, 2009, and claims priority from and the benefit of Korean Patent Application No. 10-2008-0106510, filed on Oct. 29, 2008, Korean Patent Application No. 10-2009-0001045, filed on Jan. 7, 2009, Korean Patent Application No. 10-2009-0094314, filed on Oct. 5, 2009, and Korean Patent Application No. 10-2009-0098721, filed on Oct. 16, 2009, which are hereby incorporated by reference for all purposes as if fully set forth herein.

BACKGROUND OF THE INVENTION

1. Field of the Invention

The present invention relates to a compound semiconductor light emitting diode, and more particularly, to a light emitting diode which may be connected to an alternating current (AC) power source.

2. Discussion of the Background

Compound semiconductor light emitting diodes (LEDs), e.g., GaN-based LEDs are widely used for display elements and backlights. Further, these LEDs may consume less electric power and have a longer lifespan compared with conventional light bulbs or fluorescent lamps. Therefore, their application areas have been expanded for general illumination while substituting for conventional incandescent bulbs and fluorescent lamps.

An LED is repeatedly turned on/off depending on a direction of current when operating under AC power. Therefore, when the LED is directly connected to an AC power source, the LED may not continuously emit light and may be easily damaged due to reverse current.

An LED capable of being directly connected to a high-voltage AC power source is disclosed in PCT Patent Publication No. WO 2004/023568A1 (SAKAI et al.), entitled "LIGHT-EMITTING DEVICE HAVING LIGHT-EMITTING ELEMENTS". Further, LEDs having various structures have been developed.

According to PCT Patent Publication No. WO 2004/023568A1, light emitting elements (hereinafter, "light emitting cells") are two-dimensionally connected in series on a single insulating substrate, such as a sapphire substrate, to form light emitting cell arrays. Two light emitting cell arrays are connected to each other in reverse parallel on the substrate, so that light is continuously emitted by an AC power supply.

In PCT Patent Publication No. WO 2004/023568A1, one of the light emitting cell arrays operates during one half period of AC power, and the other array operates during the other half of the AC power. That is, half of the light emitting cells in an LED operate until a phase of the AC power is changed. Therefore, the use efficiency of the light emitting cells does not exceed 50%.

Meanwhile, Korean Patent Laid-Open Publication No. 10-2006-1800 discloses an LED, in which a bridge rectifier is formed on a substrate using light emitting cells, and an array of light emitting cells connected in series is disposed between two nodes of the bridge rectifier, so that the LED operates under AC power. Accordingly, the array of light emitting cells connected in the bridge rectifier emits light during both phases of AC power (i.e., full-wave light) regardless of changes in phase of AC power, so that the use efficiency of light emitting cells may be increased.

However, as the number of light emitting cells connected in the bridge rectifier increases, a high reverse voltage may be applied to a specific light emitting cell in the bridge rectifier, and therefore, the light emitting cell in the bridge rectifier may be damaged. As a result, the LED may be damaged. Therefore, the number of light emitting cells in the array of light emitting cells connected in the bridge rectifier may be decreased. However, when the number of light emitting cells is decreased, it may be difficult to provide an LED capable of operating under high-voltage AC power. The reverse voltage may alternatively be decreased by increasing the number of light emitting cells connected in the bridge rectifier. However, the use efficiency of light emitting cells may accordingly be lowered.

Meanwhile, efforts have been continuously made for enhancing light emission output per a chip area of a high-voltage AC LED and improving its reliability. Particularly, an LED is being developed in which a plurality of light emitting cells are arranged on a chip having a square flat contour and in which the light emitting cells are effectively and safely connected to each other using wires.

SUMMARY OF THE INVENTION

The present invention provides an LED that operates under high-voltage AC power.

The present invention also provides an LED that operates with decreased reverse voltage applied to each light emitting cell in the LED and improved use efficiency of light emitting cells.

The present invention also provides an LED having wires that effectively connect light emitting cells arranged on a substrate.

The present invention also provides an LED with improved integration of light emitting cells in a confined area.

The present invention also provides an LED with fewer wire disconnections, and that experiences decreased wire damage from external forces or moisture.

Additional features of the invention will be set forth in the description which follows, and in part will be apparent from the description, or may be learned by practice of the invention.

The present invention discloses an LED including a plurality of light emitting cells arranged on a substrate. The LED includes at least four half-wave light emitting units each including at least one light emitting cell, each half-wave light emitting unit including a first terminal and a second terminal respectively arranged at both ends thereof; and at least two full-wave light emitting units each including at least one light emitting cell, each full-wave light emitting units including a third terminal and a fourth terminal respectively arranged at both ends thereof. The third terminal of at least one full-wave light emitting unit is electrically connected to the second terminals of two of the half-wave light emitting units, and the fourth terminal of the at least one full-wave light emitting unit is electrically connected to the first terminals of other two half-wave light emitting units. Also, a first half-wave light emitting unit is connected in series between the third terminal of a first full-wave light emitting unit and the fourth terminal of a second full-wave light emitting unit, and a second half-wave light emitting unit is connected in series between the fourth terminal of the first full-wave light emitting unit and the third terminal of the second full-wave light emitting unit.

The present invention also discloses an LED including a plurality of light emitting cells arranged on a substrate; a light emitting cell of the plurality of light emitting cells including a first semiconductor layer, a second semiconductor layer, and a first insulating layer including a plurality of openings, wherein the openings expose the first semiconductor layer and the second semiconductor layer; and a plurality of conductors to electrically connect the light emitting cells via the plurality of openings. A conductor electrically connects at least four light emitting cells, the conductor to electrically connect the first semiconductor layers of two of the four light emitting cells to the second semiconductor layers of the other two of the four light emitting cells.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
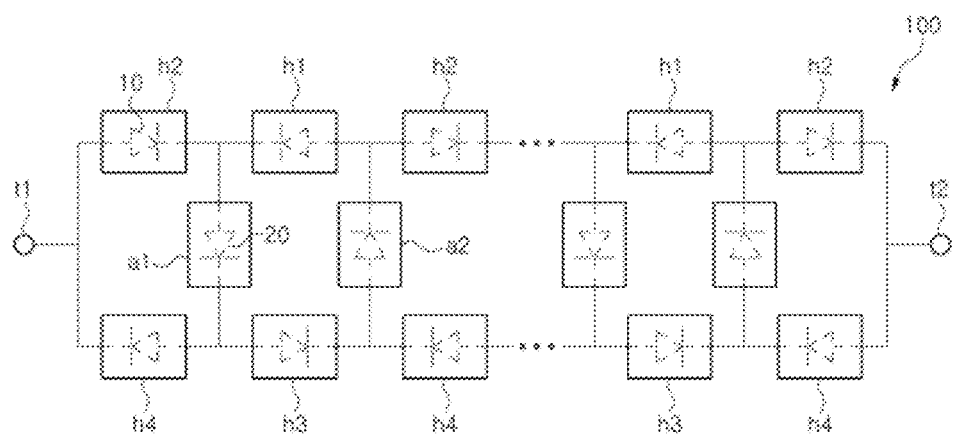
FIG. 1 is a schematic circuit diagram illustrating an LED according to a first exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a schematic circuit diagram of an LED 100 according to a first exemplary embodiment of the present invention.

Referring to FIG. 1, the LED 100 has a plurality of light emitting cells 10 and 20. The light emitting cells 10 and 20 are formed on a single substrate and electrically connected to each other through wires.

The LED 100 comprises half-wave light emitting units h1, h2, h3, and h4 and full-wave light emitting units a1 and a2. Each of the half-wave light emitting units h1, h2, h3, and h4 and the full-wave light emitting units a1 and a2 has a first terminal (e.g., anode terminal) and a second terminal (e.g., cathode terminal), and each of the full-wave light emitting units a1 and a2 has a third terminal (e.g., anode terminal) and a fourth terminal (e.g., cathode terminal). These first to fourth terminals are connected through the wires so that the light emitting units h1, h2, h3, h4, a1, and a2 are electrically connected.

Each of the half-wave light emitting units h1, h2, h3, and h4 has at least one light emitting cell 10, and each of the full-wave light emitting units a1 and a2 has at least one light emitting cell 20. When each of the light emitting units h1, h2, h3, h4, a1, and a2 comprises a plurality of light emitting cells, the light emitting cells in the respective light emitting unit are serially connected.

Meanwhile, the third terminal of each of the full-wave light emitting units a1 and a2 is electrically connected commonly to the second terminals of two half-wave light emitting units, and the fourth terminal of each of the full-wave light emitting units a1 and a2 is electrically connected commonly to the first terminals of other two half-wave light emitting units. For example, as shown in FIG. 1, the third terminal of one of the full-wave light emitting unit a2 is electrically connected commonly to the second terminals of the half-wave light emitting units h3 and h4, and the fourth terminal of the full-wave light emitting unit a2 is electrically connected commonly to the first terminals of the half-wave light emitting units h1 and h2.

In two adjacent full-wave light emitting units a1 and a2, one of the half-wave light emitting units h1 is connected in series between the third terminal of the full-wave light emitting unit a1 and the fourth terminal of the full-wave light emitting unit a2, and one of the half-wave light emitting units h3 is connected in series between the fourth terminal of the full-wave light emitting unit a1 and the third terminal of the full-wave light emitting unit a2.

Meanwhile, the LED 100 may have terminals t1 and t2 for connecting an external power source to the LED 100. Each of the terminals t1 and t2 is electrically connected to the first and second terminals of two of the half-wave light emitting units. The two half-wave light emitting units connected to the terminal t1 are connected to one of the full-wave light emitting units a1, and the two half-wave light emitting units connected to the terminal t2 are connected to one of the full-wave light emitting units a2.

The operation of the LED 100 having the terminals t1 and t2 connected to an AC power source will be described below.

First, when positive voltage is applied to the terminal t1, current sequentially flows through the terminal t1, the half-wave light emitting unit h2 (left upper end side) having the first terminal connected to the terminal t1, the full-wave light emitting unit a1, the half-wave light emitting unit h3, the full-wave light emitting unit a2, the half-wave light emitting unit h2, . . . , the full-wave light emitting unit a1, the half-wave light emitting unit h3, the full-wave light emitting unit a2, the half-wave light emitting unit h2 and the terminal t2. Accordingly, light is emitted from these light emitting units.

Next, when positive voltage is applied to the terminal t2, current sequentially flows through the terminal t2, the half-wave light emitting unit h4 (right lower end side) having the first terminal connected to the terminal t2, the full-wave light emitting unit a2, the half-wave light emitting unit h1, the full-wave light emitting unit a1, . . . , the half-wave light emitting unit h4, the full-wave light emitting unit a2, the half-wave light emitting unit h1, the full-wave light emitting unit a1, the half-wave light emitting unit h4 and the terminal t1. Accordingly, light is emitted from these light emitting units.

When positive voltage is applied to the terminal t1, the half-wave light emitting units h2 and h3 and the full-wave light emitting units a1 and a2 emit light. When positive voltage is applied to the terminal t2, the half-wave light emitting units h1 and h4 and the full-wave light emitting units a1 and a2 emit light. That is, the half-wave light emitting units h1 and h4 and the half-wave light emitting units h2 and h3 alternately emit light in accordance with a phase of AC power. The full-wave light emitting units a1 and a2 emit light in all phases of the AC power regardless of changes in phase of the AC power.

Accordingly, the number of light emitting cells turned on can be increased by the number of light emitting cells in the full-wave light emitting units a1 and a2 as compared with a conventional AC LED in which two serial LED arrays alternately operate. Further, when each of the half-wave light emitting units has one light emitting cell, the use efficiency of light emitting cells can be maximized.

The operation of the LED 100 having the terminals t1 and t2 connected to an AC power source when reverse voltage is applied to the half-wave light emitting units h1, h2, h3, and h4 will be described below.

During a half period in which positive voltage is applied to the terminal t1 so that the half-wave light emitting units h2 and h3 emit light, forward voltage is applied to the half-wave light emitting units h2 and h3 and the full-wave light emitting units a1 and a2 while reverse voltage is applied to the half-wave light emitting units h1 and h4. The reverse voltage applied to one of the half-wave light emitting units h1 is identical to the sum of forward voltage applied to a pair of the full-wave light emitting units a1 and a2 respectively connected to the first and second terminals of the half-wave light emitting unit h1 and forward voltage applied to one of the half-wave light emitting units h3 connected to the full-wave light emitting units a1 and a2. As such, the reverse voltage applied to the one half-wave light emitting unit h4 is identical to the sum of forward voltage applied to the two full-wave light emitting units a1 and a2 and forward voltage applied to the one half-wave light emitting unit h2.

Similarly, during the next half period in which positive voltage is applied to the terminal t2 so that the half-wave light emitting units h1 and h4 emit light, reverse voltage is applied to the half-wave light emitting units h2 and h3. The reverse voltage applied to one of the half-wave light emitting units h2 and h3 is identical to the sum of forward voltage applied to two of the full-wave light emitting units a1 and a2 and forward voltage applied to one of the half-wave light emitting units h4 and h1.

When the half-wave light emitting units h1, h2, h3, and h4 are configured to have the same light emitting cells, the reverse voltage applied to the half-wave light emitting units h1, h2, h3, and h4 is dependent on the number of light emitting cells in the full-wave light emitting units a1 and a2. Accordingly, the number of light emitting cells in the full-wave light emitting units a1 and a2 may be controlled, and an LED with a safe reverse voltage applied to the half-wave light emitting units h1, h2, h3, and h4 may be provided.

According to the first exemplary embodiment, the half-wave light emitting units h1, h2, h3, and h4 and the full-wave light emitting units a1 and a2 are used in the LED, and the number of light emitting cells in the light emitting units is controlled, and an LED with a safe reverse voltage and improved light emitting cell use efficiency may be provided.

Figure 2:
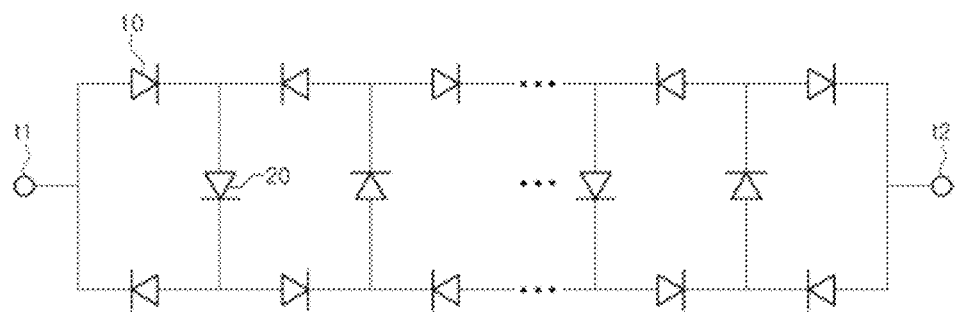
FIG. 2 is a schematic circuit diagram illustrating an example of the LED according to the first exemplary embodiment of the present invention.
Figure 3:
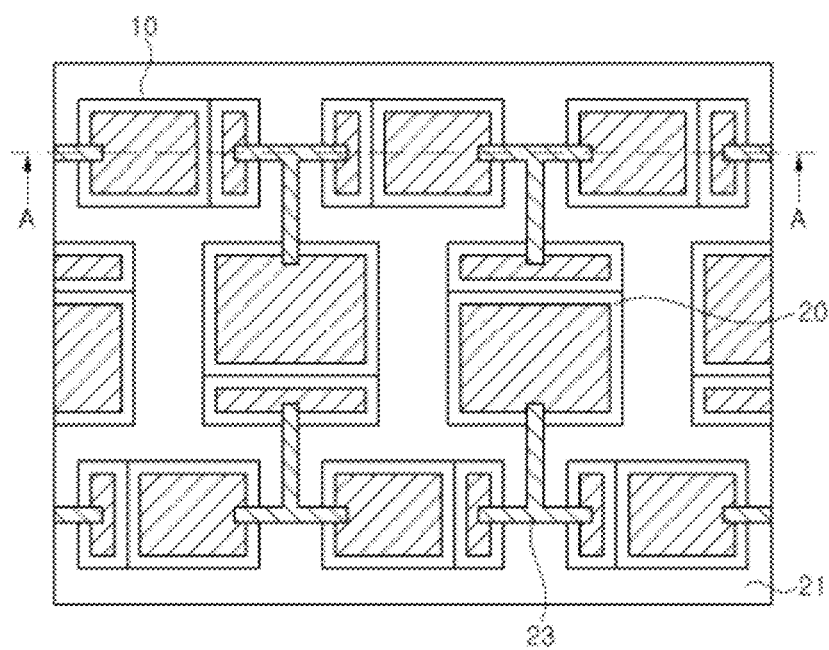
FIG. 3 is a plan view illustrating the LED of FIG. 2.
Figure 4:
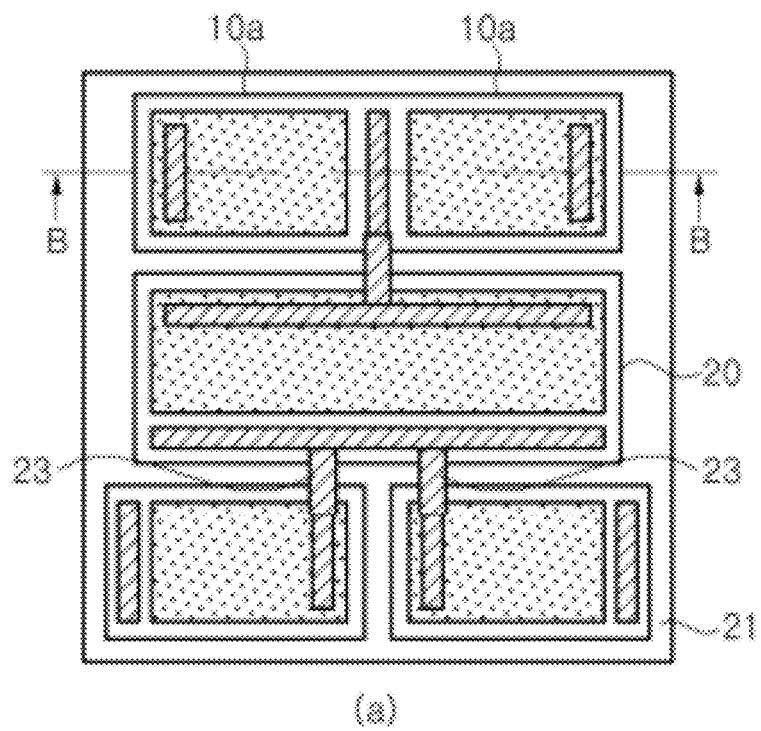
FIG. 4($a$) and FIG. 4($b$) are schematic plan views illustrating the LED of FIG. 2.
Figure 4:
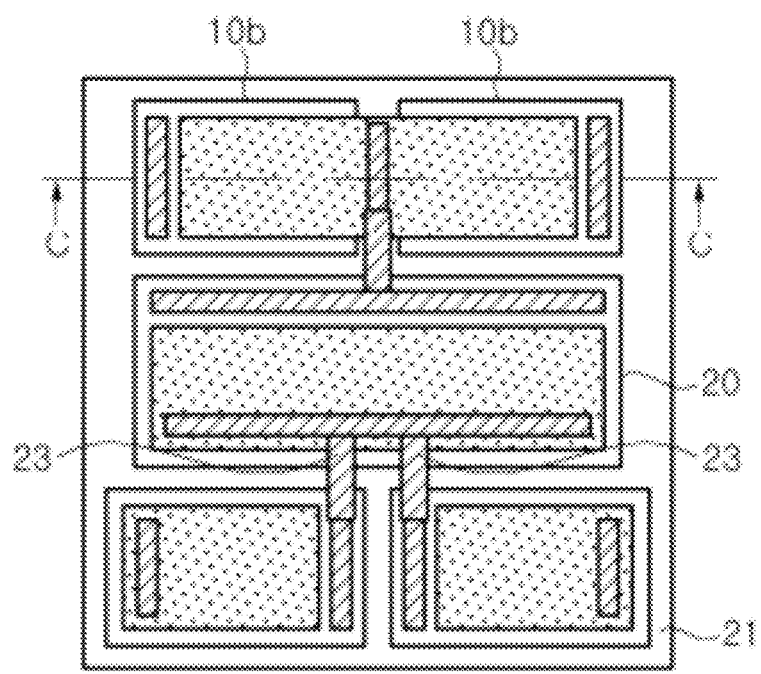

FIG. 2 is a schematic circuit diagram illustrating an example of the LED having half-wave and full-wave light emitting units according to the first exemplary embodiment, each light emitting unit of which has a single light emitting cell. FIG. 3 and FIG. 4 are schematic plan views illustrating the LED of FIG. 2.

Referring to FIG. 2, FIG. 3, and FIG. 4, light emitting cells 10 that operate during a half period and light emitting cells 20 that operate during a full period are formed on a single substrate 21. These light emitting cells 10 and 20 may be formed together through the same fabricating process and may be different from each other in size. Each of the light emitting cells 10 has a first terminal and a second terminal, and each of the light emitting cells 20 has a third terminal and a fourth terminal. Wires 23 are connected to the terminals.

As described above, each light emitting cell 20 is commonly connected to the first terminals of two of the light emitting cells 10 and commonly connected to the second terminals of other two of the light emitting cells 10. One of the light emitting cells 10 is connected in series between the third and fourth terminals of two adjacent light emitting cells 20 and another one of the light emitting cells 10 is connected in series between the fourth and third terminals of the two adjacent light emitting cells 20.

As shown in FIG. 4(a) and FIG. 4(b), light emitting cells 10a and 10b formed on the single substrate 21 may share a first or second terminal with each other. To this end, the light emitting cells 10*a* and 10*b* may be formed to share a semiconductor layer having the same polarity with each other. For example, the light emitting cells 10*a* of FIG. 4(*a*) are formed to share a lower semiconductor layer with each other, and the light emitting cells 10*b* of FIG. 4(*b*) are formed to share an upper semiconductor layer with each other. As shown in these figures, the light emitting cells 10*a* of FIG. 4(*a*) may share a second terminal with each other, and the light emitting cells 10*b* of FIG. 4(*b*) may share a first terminal with each other.

A structure for connecting the light emitting cells 10 and 20 is not particularly limited. As shown in FIG. 3, the light emitting cells 20 can be electrically connected to the light emitting cells 10 by connecting the light emitting cells 20 to wires 23 for connecting light emitting cells 10 through additional wires 23. Alternatively, as shown in FIG. 4(*a*) and FIG. 4(*b*), two of the light emitting cells 10 may be electrically connected to one of the light emitting cells 20 through two wires 23, respectively. For example, the second terminals of two of the light emitting cells 10 may be connected to the third terminal of one of the light emitting cells 20 through two wires 23.

The wires 23 may be formed using a conventional wiring process, e.g., an air bridge or step cover process. The wires 23 may all be simultaneously formed through the same process.

Figure 5:
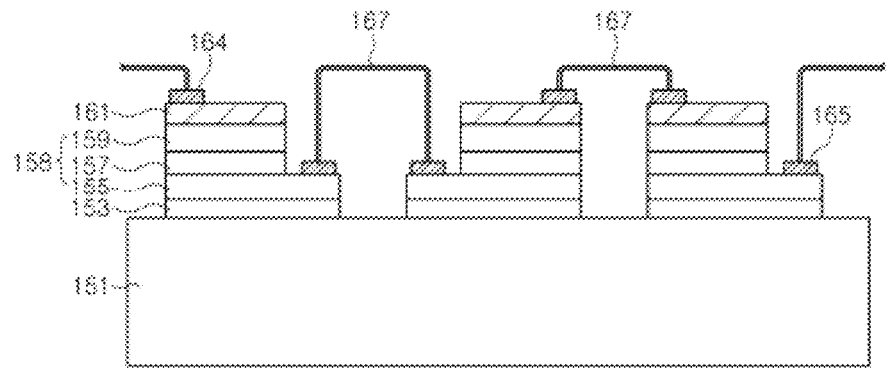
FIG. 5 and FIG. 6 are schematic partial sectional views taken along line A-A of FIG. 3, illustrating example LEDs of the first exemplary embodiment of the present invention.
Figure 6:
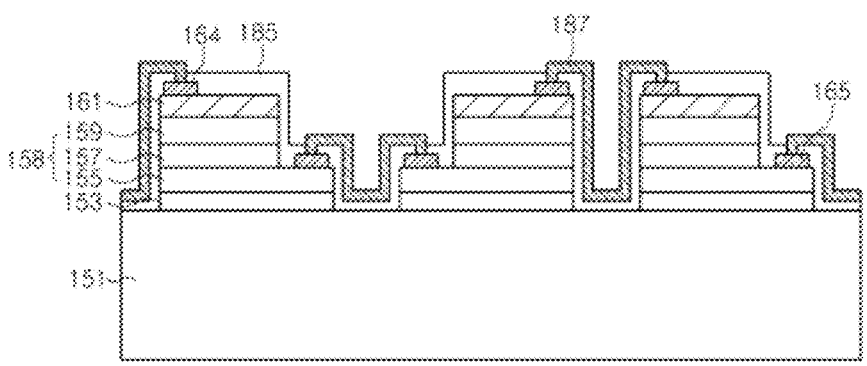

Hereinafter, the structure and wiring of the light emitting cells in the light emitting diode according to the first exemplary embodiment of the present invention will be described with reference to FIG. 5, FIG. 6, FIG. 7, FIG. 8, FIG. 9, and FIG. 10. FIG. 5 and FIG. 6 are schematic sectional views taken along line A-A of FIG. 3, respectively. Here, FIG. 5 is a partial sectional view illustrating light emitting cells electrically connected through wires that are formed by an air bridge process, and FIG. 6 is a partial sectional view illustrating light emitting cells electrically connected through wires that are formed by a step cover process.

Referring to FIG. 5, a plurality of light emitting cells 158 are positioned on a single substrate 151 to be spaced apart from each other. Each of the light emitting cells 158 comprises a first conductive-type lower semiconductor layer 155, an active layer 157, and a second conductive upper semiconductor layer 159. The active layer 157 may be formed to have a single well structure or a multiple quantum well structure, and the material and composition of the active layer 157 may be selected depending on the required wavelength of light. For example, the active layer may be formed of an AlInGaN-based compound semiconductor such as InGaN. Meanwhile, the lower and upper semiconductor layers 155 and 159 may be formed of a material of which the band gap is larger than that of the active layer 157 and may be made of an AlInGaN based compound semiconductor such as GaN.

Meanwhile, a buffer layer 153 may be interposed between the lower semiconductor layer 155 and the substrate 151. The buffer layer 153 is adopted to reduce the lattice mismatch between the substrate 151 and the lower semiconductor layer 155. Although the buffer layer 153 may be formed discontinuously as shown in FIG. 5, the present invention is not limited thereto. If the buffer layer 153 is made of an insulating material or a large resistive material, the buffer layer may be formed continuously.

As shown in FIG. 5, the upper semiconductor layer 159 is formed on top of a portion of the lower semiconductor layer 155, and the active layer 157 is interposed between the upper and lower semiconductor layers 159 and 155. A transparent electrode layer 161 may be formed on the upper semiconductor layer 159. The transparent electrode layer 161 may be formed of a material such as indium tin oxide (ITO), Ni/Au, or the like.

Meanwhile, wires 167 electrically connect the light emitting cells 158. The wires 167 may all be simultaneously formed through the same process. Also, a conductive material for the wires 167 is not particularly limited but may be the same material as the transparent electrode layer 161, e.g., ITO or Ni/Au. The wires 167 connect the lower semiconductor layers 155 of the light emitting cells to each other and connect the transparent electrode layers 161 of the light emitting cells to each other. As shown in this figure, the wires 167 may connect p-electrodes 164 formed on the transparent electrode layer 161 to each other and connect n-electrodes 165 formed on exposed regions of the lower semiconductor layer 155 to each other. Here, the electrodes 164 and 165 serve as anode and cathode terminals of the light emitting cells. The wires 167 are formed through an air bridge process so that the other portions of the wires 167, except for the contact portion, are physically spaced apart from the substrate 151 and the light emitting cells 158. An array of light emitting cells which are serially connected to each other on the single substrate 151 through the wires 167 is formed.

Referring to FIG. 6, the wires 187 may be formed by a step cover process. That is, except for the portions of the light emitting cells 158 to be in contact with wires 187, all the layers of the light emitting cells 158 and the substrate 151 are covered with an insulation layer 185. Then, the wires 187 electrically connect the light emitting cells to each other on the insulation layer 185.

The insulation layer 185 has openings through which the electrode pads 164 and 165 are exposed, and the wires 187 connect the electrode pads 164 and 165 of adjacent light emitting cells to each other through the openings so that the light emitting cells 158 are serially connected to each other.

The electrode pads 164 and 165 of the light emitting cells 158 may be formed of the same material as that of the wires 187 and may be formed together when the wires 187 are formed. That is, the electrode pads 164 and 165 may not be separately formed, but the wires 187 may be directly electrically connected to the lower semiconductor layers 155 and the upper semiconductor layers 159 or transparent electrode layers 161.

Figure 7:
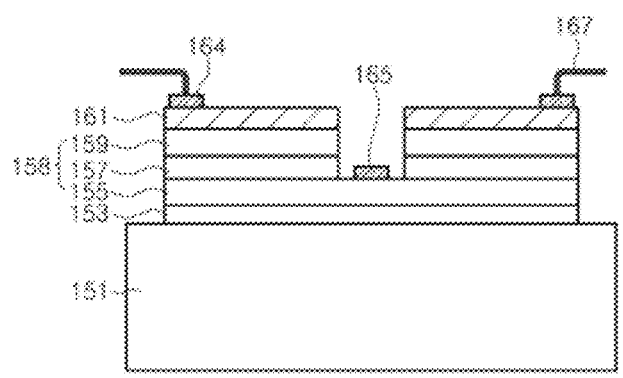
FIG. 7 and FIG. 8 are partial sectional views taken along line B-B of FIG. 4($a$).
Figure 8:
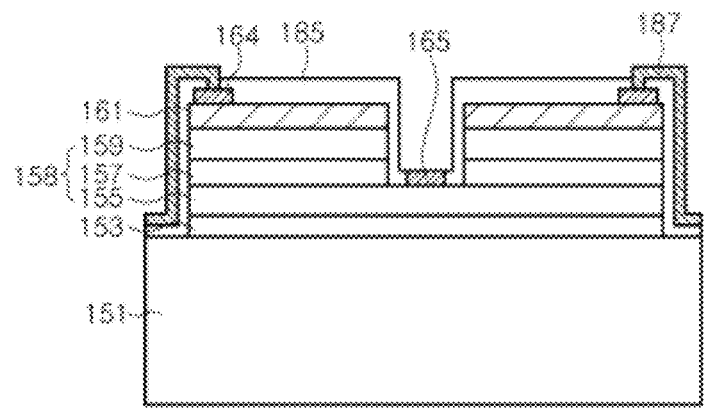

FIG. 7 and FIG. 8 are partial sectional views taken along line B-B of FIG. 4(*a*). FIG. 7 is a partial sectional view illustrating that light emitting cells 158 are electrically connected to each other through wires 167 that are formed by an air bridge process, and FIG. 8 is a partial sectional view illustrating that light emitting cells 158 are electrically connected to each other through wires 187 that are formed by a step cover process.

The structure of light emitting cells 158 illustrated in FIG. 7 and FIG. 8 is similar to the structure of light emitting cells 158 described above, but the light emitting cells 158 illustrated in FIG. 7 and FIG. 8 are formed to share a first conductive-type lower semiconductor layer 155 with each other. An electrode formed on the first conductive-type lower semiconductor layer 155, e.g., an n-electrode 165, may be formed between second conductive-type upper semiconductor layers 159, and may be formed so that the distance from the second conductive-type upper semiconductor layers 159 is constant. Meanwhile, the second conductive-type upper semiconductor layers 159 are separated from each other.

Figure 9:
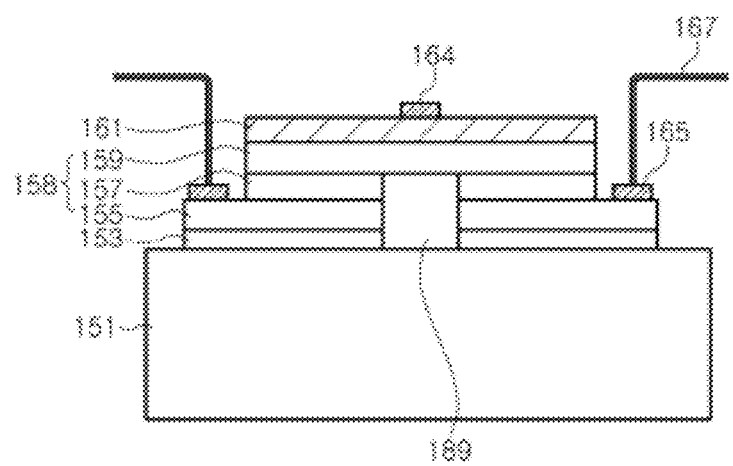
FIG. 9 and FIG. 10 are partial sectional views taken along line C-C of FIG. 4($b$).
Figure 10:
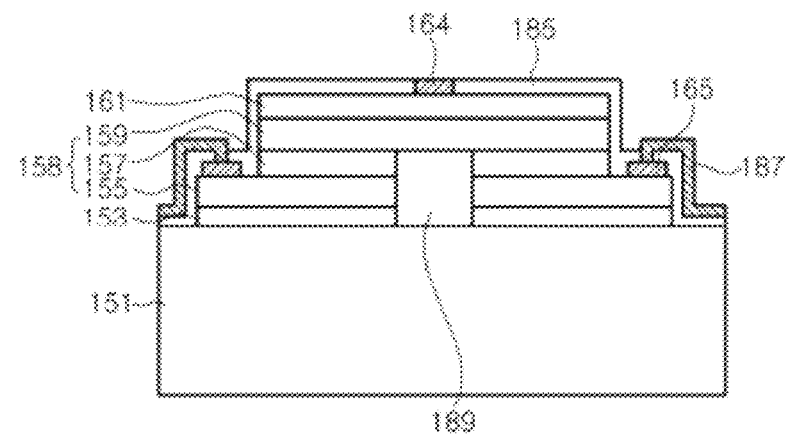

FIG. 9 and FIG. 10 are partial sectional views taken along line C-C of FIG. 4(*b*). Here, FIG. 9 is a partial sectional view illustrating light emitting cells 158 electrically connected to each other through wires 167 that are formed by an air bridge process, and FIG. 10 is a partial sectional view illustrating light emitting cells 158 electrically connected to each other through wires 187 that are formed by a step cover process.

The structure of light emitting cells 158 illustrated in FIG. 9 and FIG. 10 is similar to the structure of light emitting cells 158 described above, but the light emitting cells 158 illustrated in FIG. 9 and FIG. 10 are formed to share second conductive-type upper semiconductor layers 159 with each other. First conductive-type lower semiconductor layers 155 and active layers 157, which are formed under the second conductive-type upper semiconductor layer 159, are separated from each other, and the space between the first conductive-type lower semiconductor layers 155 may be filled with an insulating layer 189.

Although it has been described in the first exemplary embodiment that each of the half-wave and full-wave light emitting units comprises a single light emitting cell, each light emitting unit may comprise a plurality of light emitting cells 10 and 20. Particularly, each half-wave light emitting unit may comprise one light emitting cell 10 while each full-wave light emitting unit may comprise a plurality of light emitting cells 20. An example of an LED in which each half-wave light emitting unit comprises one light emitting cell 10 and each full-wave light emitting unit comprises two light emitting cells 20 is schematically shown in FIG. 11.

Figure 11:
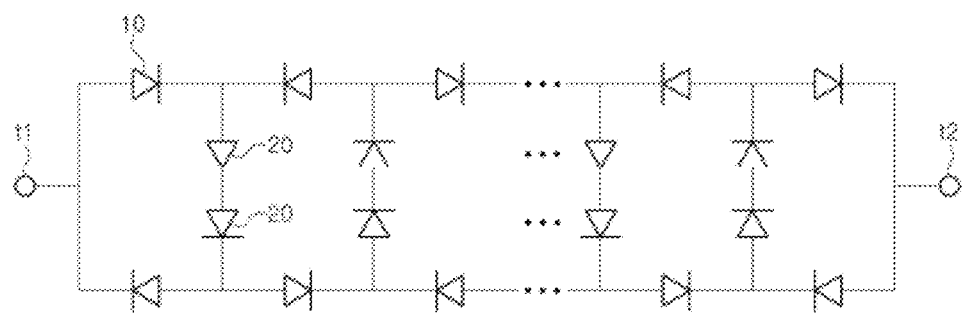
FIG. 11 is a schematic circuit diagram illustrating another example LED according to the first exemplary embodiment of the present invention.

Referring to FIG. 11, each full-wave light emitting unit has two light emitting cells 20. In the example LED illustrated in FIG. 11, the use efficiency of light emitting cells 20 can be increased compared with an LED where each full-wave light emitting unit has one light emitting cell 20.

Each of the full-wave light emitting units may have two or more light emitting cells 20, and it is not required that the full-wave light emitting units all have the same number of light emitting cells 20. As the number of light emitting cells 20 in the full-wave light emitting units is increased, the reverse voltage applied to the half-wave light emitting units is increased. Therefore, the number of light emitting cells 20 in the full-wave light emitting units may be selected in consideration of the reverse voltage applied to the half-wave light emitting units, preferably in a range of 1 to 10.

Figure 12:
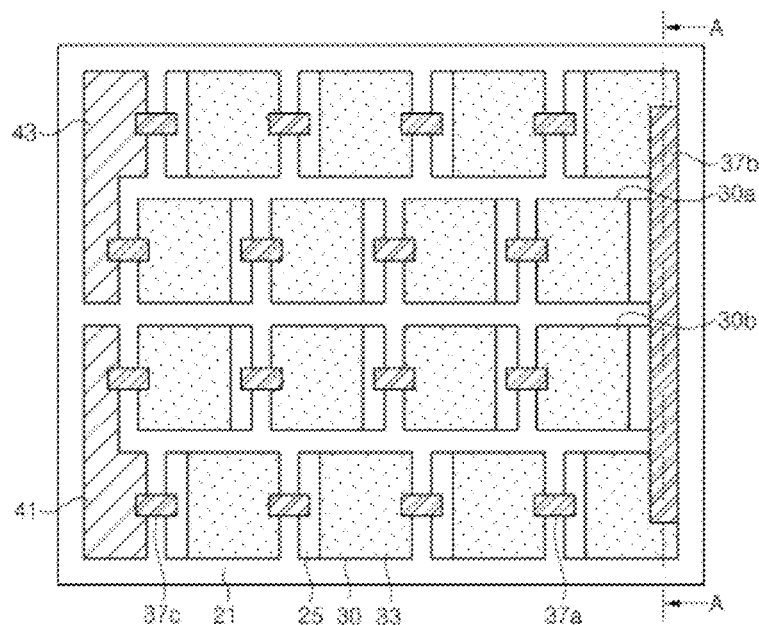
FIG. 12 is a plan view illustrating an LED according to a second exemplary embodiment of the present invention.

FIG. 12 is a schematic plan view illustrating an LED according to a second exemplary embodiment of the present invention.

Referring to FIG. 12, the LED comprises a substrate 21, a plurality of light emitting cells 30, wires 37a, 37b and 37c and bonding pads 41 and 43. The light emitting cells 30 are formed on the single substrate 21 and connected in series through the wires 37a and 37b to define arrays thereof. The arrays of the light emitting cells 30 are connected to the bonding pads 41 and 43 through the wires 37c. The arrays of the light emitting cells 30 can be connected in reverse parallel between the bonding pads 41 and 43 to thereby operate under AC power.

The substrate 21 may include any substrate capable of electrically isolating the light emitting cells 30 from each other. Although the substrate may be a growth substrate, on which nitride semiconductors for forming light emitting cells may be grown, e.g., a sapphire substrate, the present invention is not limited thereto. For example, the substrate 21 may be a bonding substrate that is bonded to nitride semiconductors grown on a growth substrate. A sapphire substrate may be used as a bonding substrate.

The wires 37a electrically connect the first and second terminals of the light emitting cells 30, the wire 37b electrically connects four of the light emitting cells 30 in sequence, and the wires 37c electrically connect the light emitting cells 30 to the bonding pads 41 and 43. Each of the bonding pads 41 and 43 is connected to first and second terminals of at least two of the light emitting cells 30 through the wires 37c. Although the bonding pads 41 and 43 may be formed in the same shape, the present invention is not limited thereto. That is, the bonding pads 41 and 43 may be formed in different shapes from each other. The bonding pads 41 and 43 may be formed on the substrate 21 or formed on the first or second conductive-type semiconductor layer 25 or 29.

Both ends of the wire 37b are electrically connected to the first terminals of two of the light emitting cells 30, respectively, and the second terminals of other two of the light emitting cells 30a and 30b positioned between the two light emitting cells 30 are electrically connected to the wire 37b. Alternatively, both the ends of the wire 37b may be electrically connected to the second terminals of two of the light emitting cells 30, respectively, and the first terminals of other two of the light emitting cells 30a and 30b positioned between the former two light emitting cells may be electrically connected to the wire 37b. For example, if the polarities of the light emitting cells 30 of FIG. 12 are all changed, it is possible to obtain the arrangement in which the second terminals of the two light emitting cells 30 are connected to both the ends of the wire 37b, respectively.

According to the second exemplary embodiment, the light emitting cells 30 may be formed to have the same area or formed to have different areas. As illustrated in FIG. 12, each of the light emitting cells 30 comprises a first conductive-type semiconductor layer 25, an active layer (not shown) and a second conductive-type semiconductor layer (not shown). When the first conductive-type semiconductor layer 25 is made of an n-type material, the second conductive-type semiconductor layer is made of a p-type material, wherein a transparent electrode layer 33 may be formed on the second conductive-type semiconductor layer. The structure of the light emitting cells 30 and the wire 37b will be described in detail with reference to FIG. 13 and FIG. 14.

Figure 13:
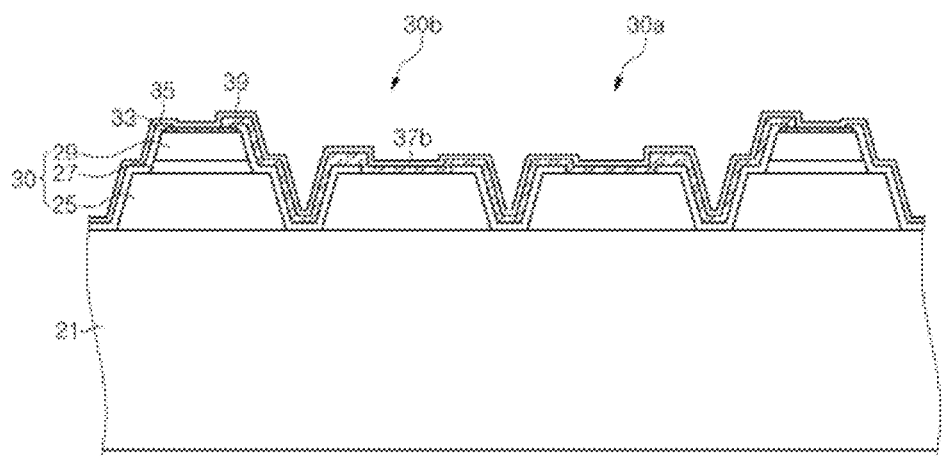
FIG. 13 is a sectional view taken along line A-A of FIG. 12 illustrating the LED according to the second exemplary embodiment of the present invention.

FIG. 13 is a sectional view taken along line A-A of FIG. 12, illustrating the LED according to the second exemplary embodiment of the present invention.

Referring to FIG. 13, four light emitting cells 30 are shown on the substrate 21. The light emitting cells 30 are formed to be spaced apart from each other. Each of the light emitting cells 30 comprises a first conductive-type semiconductor layer 25, an active layer 27, and a second conductive-type semiconductor layer 29. The active layer 27 may be formed to have a single well structure or multiple quantum well structure, and the material and composition of the active layer 27 may be selected depending on the required wavelength of light. For example, the active layer 27 may be formed of an AlInGaN-based compound semiconductor such as InGaN. Meanwhile, the first and second conductive-type semiconductor layers 25 and 29 may be formed of a material of which the band gap is larger than that of the active layer 27 and may be made of an AlInGaN based compound semiconductor such as GaN.

Meanwhile, a buffer layer (not shown) may be interposed between the first conductive-type semiconductor layer 25 and the substrate 21. When the first conductive-type semiconductor layer 25 is grown on the substrate 21, the buffer layer is adopted to reduce the lattice mismatch between the substrate 21 and the first conductive-type semiconductor layer 25.

As shown in FIG. 13, the second conductive-type semiconductor layer 29 is positioned on top of a portion of the first conductive-type semiconductor layer 25, and the active layer 27 is interposed between the first and second conductive-type semiconductor layers 25 and 29. A transparent electrode layer 33 may be formed on the second conductive-type semiconductor layer 29. The transparent electrode layer 33 may be formed of a material such as indium tin oxide (ITO), Ni/Au, or the like.

The wire 37b is formed along an edge of the substrate 21 to electrically connect the four light emitting cells 30. The wire 37b electrically connects the light emitting cells 30 to each other in sequence across upper portions of the light emitting cells 30. The wire 37b electrically connects second terminals, e.g., the first conductive-type semiconductor layers 25, of two of the light emitting cells 30a and 30b, and first terminals, e.g., the second conductive-type semiconductor layers 29 or the transparent electrode layers 33, of other two of the light emitting cells 30. As shown in FIG. 13, both the ends of the wire 37b are connected to the first terminals of the two light emitting cells 30, respectively, while the wire 37b is electrically connected to the second terminals of the other two light emitting cells 30a and 30b that are positioned between the two light emitting cells 30.

The wires 37a, 37b, and 37c are formed on a first insulating layer 35 and isolated from sidewalls of the light emitting cells 30. The first insulating layer 35 may be formed of a silicon oxide or silicon nitride film. The wires 37a, 37b, and 37c may be covered with a second insulating layer 39. The second insulating layer 39 covers the wires 37a, 37b, and 37c and light emitting cells 30 to protect them from external force or moisture. The second insulating layer 39 may be formed of a silicon oxide or silicon nitride film. The second insulating layer 39 may be formed of the same material as that of the first insulating layer 35 so as to increase adhesion. When the first insulating layer 35 is thin, an electrical short circuit may be caused between the wires 37a, 37b, and 37c and the light emitting cells 30. Particularly, when the LED operates under high-voltage AC power, a breakdown may occur. Therefore, the first insulating layer 35 may be relatively thicker than the second insulating layer 39.

The light emitting cells 30 may be disposed in a matrix form on the single substrate 21, and disposed so that the light emitting cells 30 alternately emit light row by row. Electrical properties of an array of light emitting cells 30 disposed in a row may be measured using the wire 37b in a process of fabricating LEDs. That is, in FIG. 12, voltage or current is applied to the bonding pad 41 or 43 and the wire 37b, thereby measuring electrical properties of the light emitting cells 30 row by row. Such measurement may help to detect the position of an electrical defect in the light emitting cells 30.

Figure 14:
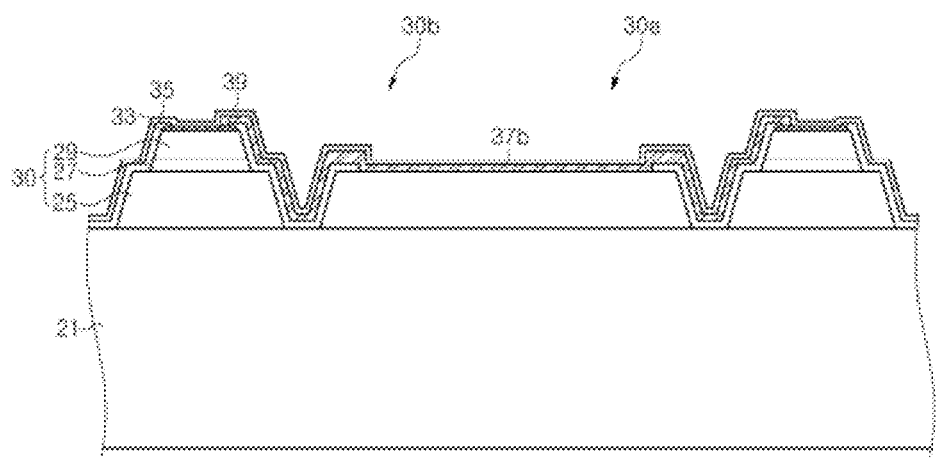
FIG. 14 is a sectional view of an LED according to a third exemplary embodiment of the present invention.

FIG. 14 is a sectional view illustrating an LED according to a third exemplary embodiment of the present invention.

Referring to FIG. 14, the LED according to the third exemplary embodiment is roughly similar to that described with reference to FIG. 13, but is different therefrom in that two light emitting cells 30a and 30b, which are positioned between other two light emitting cells 30 respectively connected to both ends of a wire 37b, share a first conductive-type semiconductor layer 25. That is, the first conductive-type semiconductor layers 25 of the two light emitting cells 30a and 30b are not separated from each other, similar to the light emitting cell 158 shown in FIG. 7. Second conductive-type semiconductor layers 29 of the two light emitting cells 30a and 30b are separated from each other.

When the first conductive-type semiconductor layers 25 of the light emitting cells 30a and 30b are shared, the separated region between the light emitting cells 30a and 30b disappears, and therefore, it is possible to reduce a stepped region in the LED. Accordingly, the wire 37b may be easily formed, and wiring reliability may be improved.

Figure 15:
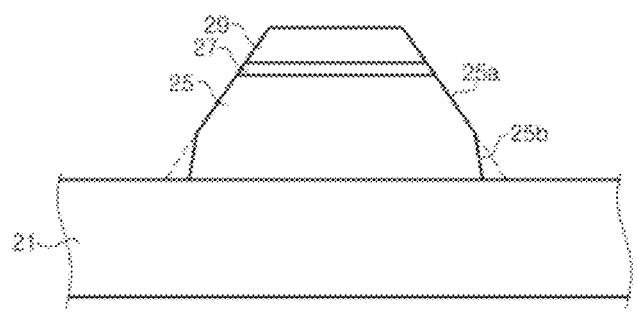
FIG. 15 is a partial sectional view illustrating a light emitting cell according to exemplary embodiments of the present invention.

FIG. 15 is a partial sectional view illustrating a light emitting cell according to exemplary embodiments of the present invention.

In FIG. 13 and FIG. 14, the first conductive-type semiconductor layer 25 of each light emitting cell 30 has a single inclined plane. Such an inclined plane helps a wire to be stably formed thereon. However, when the first conductive-type semiconductor layer 25 is relatively thicker than the active layer 27 and the second conductive-type semiconductor layer 29 has an inclined plane, the width of a lower region of the light emitting cell 30 may be increased depending on the slope of the inclined plane. Therefore, the single inclined plane of the first conductive-type semiconductor layer 25 may hinder light emitting cells 30 on a substrate of a limited area from being integrated.

As shown in FIG. 15, the first conductive-type semiconductor layer 25 of each light emitting cell may have first and second inclined planes 25a and 25b. The second inclined plane 25b is positioned closer to a substrate 21 than the first inclined plane 25a. The first and second inclined planes 25a and 25b have different slopes with respect to a plane of the substrate 21. The second inclined plane 25b may have a steeper slope than that of the first inclined plane 25a, as shown in FIG. 15, or the first inclined plane 25a may have a steeper slope than that of the second inclined plane 25b. Accordingly, the first conductive-type semiconductor layer 25 with first and second inclined planes 25a and 25b may provide a narrower light emitting cell 30 than that of the light emitting cell 30 having a single inclined plane, i.e., the light emitting cell 30 having only the first slope plane 25a illustrated in FIG. 15. Consequently, a larger number of light emitting cells 30 may be integrated in a confined area. Moreover, a wire may be more easily formed on inclined planes with different slopes.

The first conductive-type semiconductor layer 25 may be formed to have a multi-layered structure. An undoped semiconductor layer may be included in the multi-layered structure. Also, a buffer layer (not shown) may be interposed between the substrate 21 and the second conductive-type semiconductor layer 25.

Figure 16:
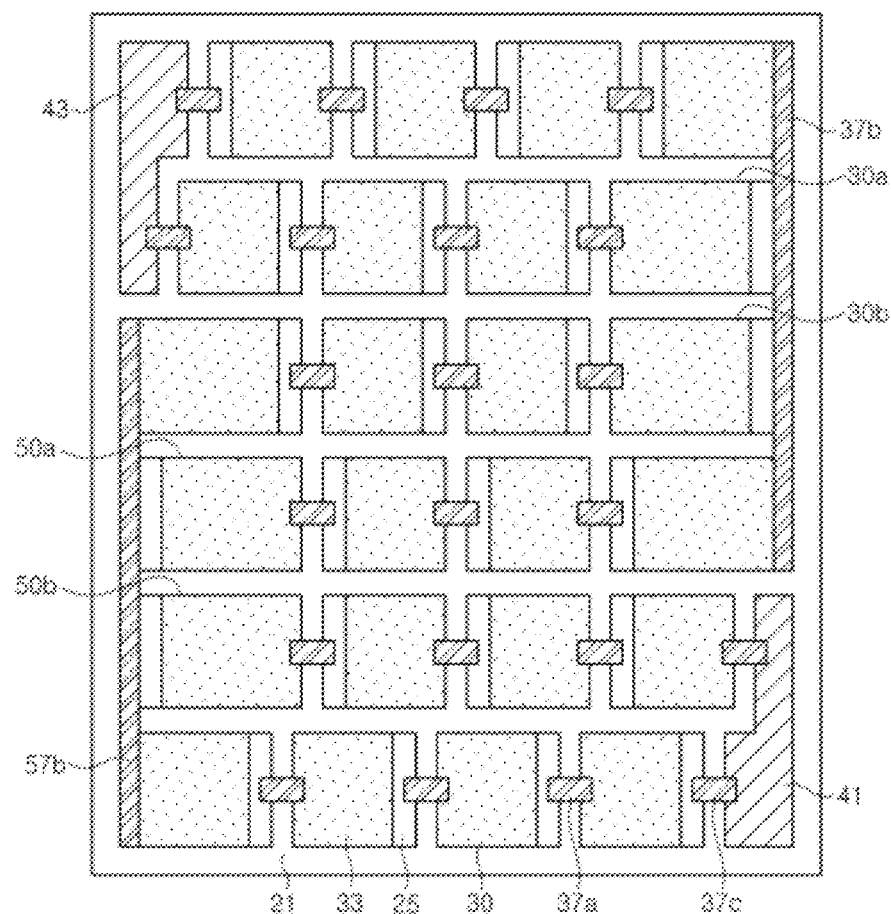
FIG. 16 is a plan view of an LED according to a fourth exemplary embodiment of the present invention.

FIG. 16 is a plan view illustrating an LED according to a fourth exemplary embodiment of the present invention.

Referring to FIG. 16, the LED according to the fourth exemplary embodiment is roughly similar to the second exemplary embodiment described with reference to FIG. 12, but is different therefrom in that light emitting cells 30 are arranged in six rows. In the fourth exemplary embodiment, bonding pads 41 and 43 may be disposed in a diagonal direction. In addition to a wire 37b for connecting four of the light emitting cells 30, a wire 57b for connecting other four of the light emitting cells 30 may be formed.

Like the wire 37b described with reference to FIG. 12, the wire 57b is sequentially electrically connected across the four light emitting cells. The wire 57b is connected to the first terminals of two of the light emitting cells 30 and the second terminals of other two of the light emitting cells 50a and 50b. Both ends of the wire 57b may be connected to the first terminals of the two light emitting cells 30, respectively, and the second terminals of the other two light emitting cells 50a and 50b positioned between the two light emitting cells 30 may be connected to the wire 57b. In the fourth exemplary embodiment, the light emitting cells 50a and 50b may share a first conductive-type semiconductor layer 25.

Alternatively, both the ends of the wire 57b may be connected to the second terminals of the two light emitting cells 30, respectively, and the first terminals of the other two light emitting cells 50a and 50b positioned between the two light emitting cells 30 may be connected to the wire 57b. The order of the four light emitting cells connected to the wire 37b is opposite to that of the four light emitting cells connected to the wire 57b. When odd-numbered light emitting cells 30 constitute a row by increasing the number of light emitting cells 30 in the row, the arrangement is configured such that the order of the light emitting cells 30 connected to the wire 37b is opposite to that of the light emitting cells 30 connected to the wire 57b. The first conductive-type semiconductor layers 25 of the two light emitting cells 50a and 50b positioned between the two light emitting cells 30 respectively connected to both the ends of the wire 57b are separated from each other.

The wires 37b and 57b are disposed along both edges of a substrate 21, respectively, and may be positioned in a diagonal direction. Accordingly, light emitting cells 30 can be disposed in a matrix form and disposed such that the light emitting cells 30 alternately emit light row by row.

Figure 17:
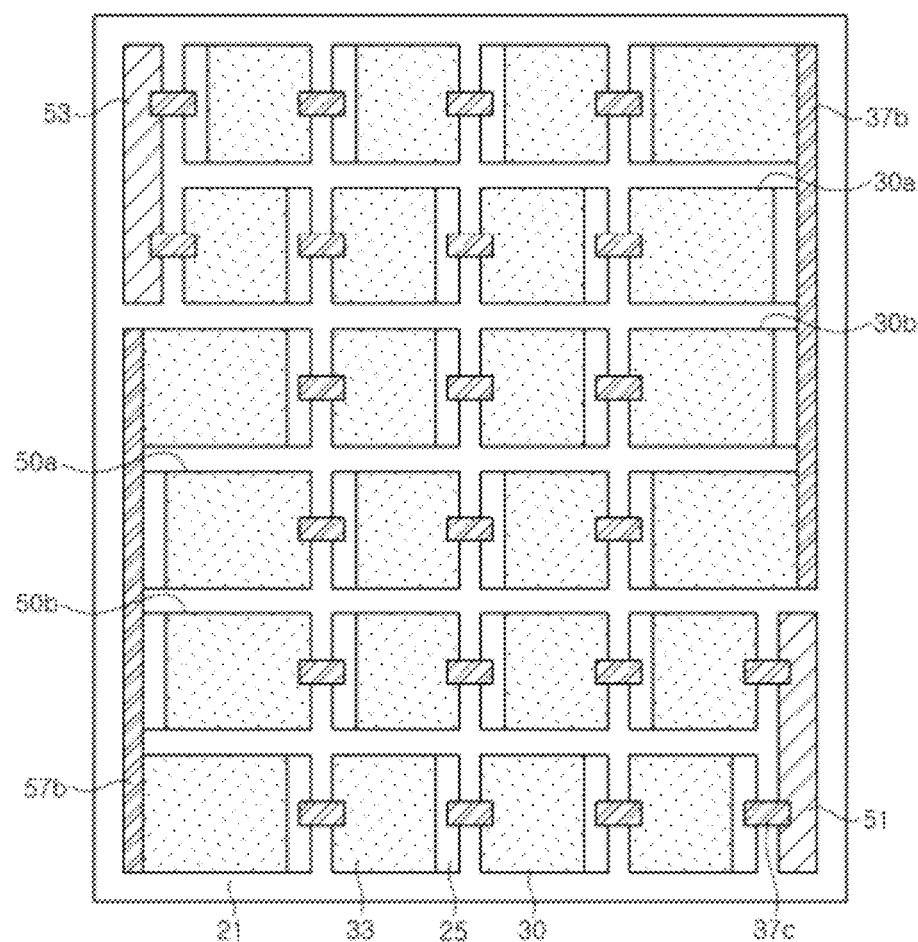
FIG. 17 is a plan view of an LED according to a fifth exemplary embodiment of the present invention.

FIG. 17 is a plan view illustrating an LED according to a fifth exemplary embodiment of the present invention.

Referring to FIG. 17, the LED according to the fifth exemplary embodiment is roughly similar to the fourth exemplary embodiment described with reference to FIG. 16, but is different therefrom in that bonding pads 51 and 53 are different from the bonding pads 41 and 43 of FIG. 16 in shape. That is, while each of the bonding pads 41 and 43 comprises a portion having a broad area and a portion extending therefrom, each of the bonding pads 51 and 53 illustrated in FIG. 17 has a rectangular shape. The shape of each bonding pad 51 or 53 is not particularly limited but may be variously modified depending on the size and arrangement of light emitting cells 30. Particularly, the bonding pads 51 and 53 may be positioned in the area in which the light emitting cells 30 are arranged.

Figure 18:
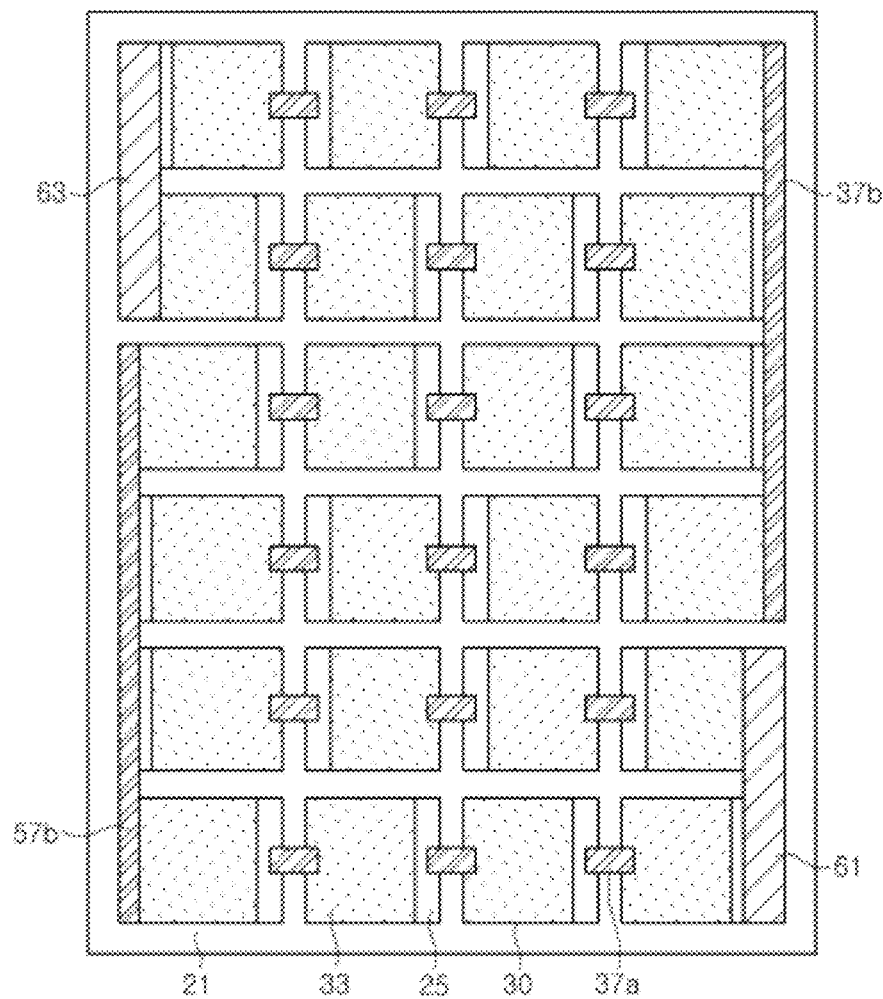
FIG. 18 is a plan view of an LED according to a sixth exemplary embodiment of the present invention.

FIG. 18 is a plan view illustrating an LED according to a sixth exemplary embodiment of the present invention.

Referring to FIG. 18, the LED according to the sixth exemplary embodiment is roughly similar to the fifth exemplary embodiment described with reference to FIG. 16, but is different therefrom in that bonding pads 61 and 63 are formed on light emitting cells 30. That is, each of the bonding pads 61 and 63 are formed on first and second terminals of two of the light emitting cells 30 and electrically connected thereto. Therefore, the wires 37c for connecting the bonding pads to the light emitting cells may be omitted.

Figure 19:
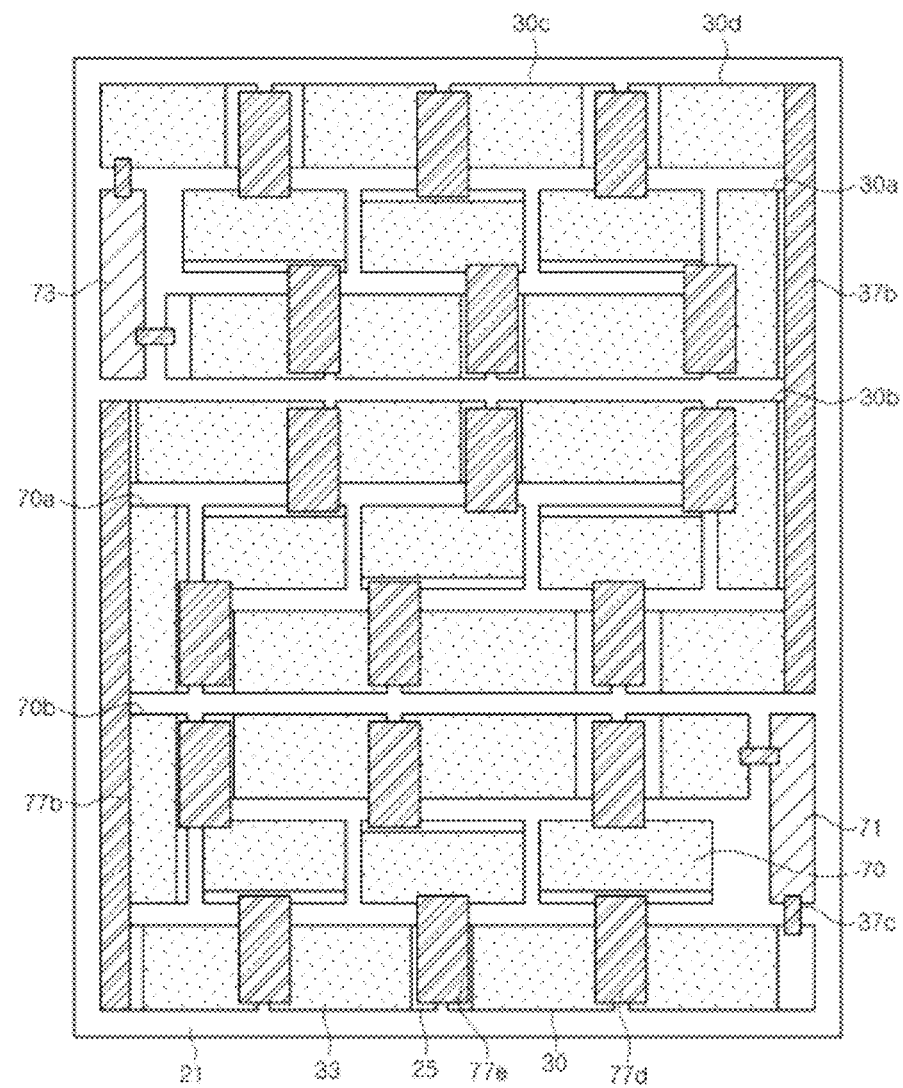
FIG. 19 is a plan view of an LED according to a seventh exemplary embodiment of the present invention.
Figure 20:
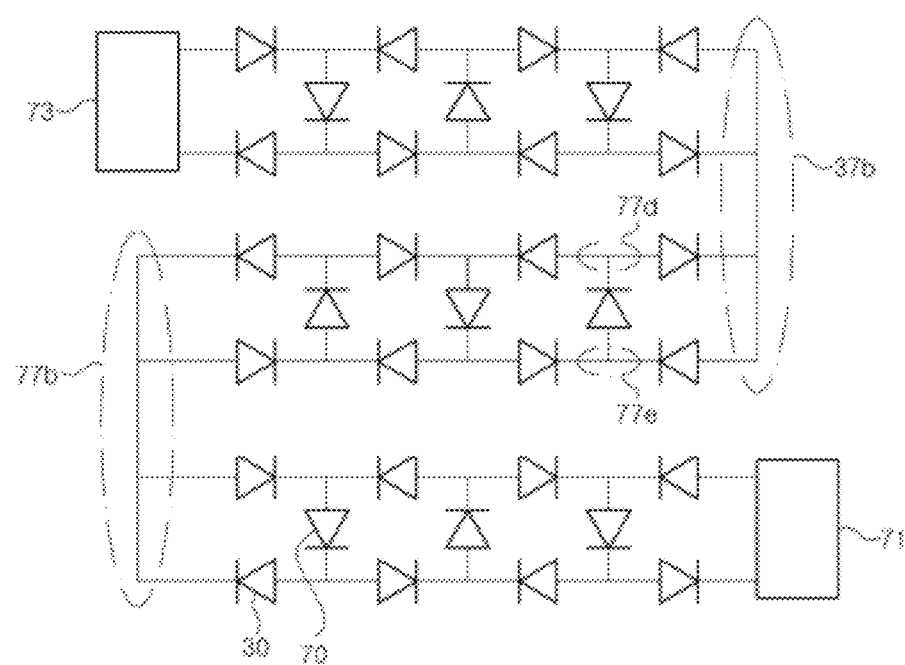
FIG. 20 is an equivalent circuit diagram of the LED illustrated in FIG. 19.

FIG. 19 is a plan view illustrating an LED according to a seventh exemplary embodiment of the present invention, and FIG. 20 is a schematic equivalent circuit diagram of the LED illustrated in FIG. 19.

Referring to FIG. 19 and FIG. 20, the LED comprises a substrate 21, bonding pads 71 and 73, a plurality of half-wave light emitting cells 30, a plurality of full-wave light emitting cells 70, and wires 37b, 37c, 77b, 77e, and 77d. The half-wave light emitting cell 30 refers to a light emitting cell to which forward voltage is applied during a half period of AC power, and the full-wave light emitting cell 70 refers to a light emitting cell to which forward voltage is applied during a full period of the AC power.

The substrate 21 and the half-wave light emitting cells 30 illustrated in FIG. 19 and FIG. 20 are similar to those described with reference to the second exemplary embodiment and illustrated in FIG. 12 and FIG. 13. However, in the seventh exemplary embodiment the light emitting cells 30 positioned in a row are disposed to face each other. That is, light emitting cells 30c and 30d are disposed such that their first terminals face each other or their second terminals face each other.

Each of the full-wave light emitting cells 70 is disposed between rows of the half-wave light emitting cells 30 and has third and fourth terminals respectively corresponding to the first and second terminals of each half-wave light emitting cell 30. The fourth terminal of the full-wave light emitting cell 70 is electrically connected to first terminals of two of the half-wave light emitting cells 30 through the wire 77d, and the third terminal of the full-wave light emitting cell 70 is electrically connected to second terminals of two of the half-wave light emitting cells 30 through the wire 77e. One of the half-wave light emitting cells 30 is disposed in a forward direction between the third terminal of one of the full-wave light emitting cells 70 and the fourth terminal of another adjacent one of the full-wave light emitting cells 70 while one of the half-wave light emitting cells 30 is disposed in a forward direction between the fourth terminal of the full-wave light emitting cell 70 and the third terminal of the adjacent full-wave light emitting cell 70.

Thus, the seventh exemplary embodiment discloses an LED in which the half-wave light emitting cells 30 alternately operate and the full-wave light emitting cells 70 operate during a full period when the bonding pads 71 and 73 are connected to an AC power source. Accordingly, the use efficiency of the light emitting cells operating on the single substrate 21 may be improved. Further, the reverse voltage applied to the half-wave light emitting cells 30 during a half period may be low.

Although FIG. 19 and FIG. 20 illustrates one of the full-wave light emitting cells 70 disposed between rows of the half-wave light emitting cells 30, a plurality of full-wave light emitting cells 70 in an array form may be disposed between the rows of the half-wave light emitting cells 30. A plurality of half-wave light emitting cells 30 in an array form may be disposed between adjacent full-wave light emitting cells 70. However, the number of half-wave or full-wave light emitting cells 30 and 70 in an array form is limited in consideration of reverse voltage applied to the half-wave light emitting cells 30.

Since the half-wave light emitting cells 30 may be disposed to face each other, each of the wires 77d and 77e may connect one of the full-wave light emitting cells 70 to two of the half-wave light emitting cells 30 without branching off. Accordingly, the stability of wiring may be improved.

As described with reference to FIG. 12 and FIG. 13, the wire 37b electrically connects four of the light emitting cells. Also, the wire 77b may be disposed in a diagonal direction with respect to the wire 37b and may electrically connect other four of the light emitting cells. Both ends of the wire 77b are connected to the second terminals of two of the half-wave light emitting cells 30, respectively, and the first terminals of the other two of the half-wave light emitting cells 70a and 70b disposed between the two light emitting cells 30 are connected to the wire 77b. Alternatively, like the wire 37b, both the ends of the wire 77b may also be connected to the first terminals of the two half-wave light emitting cells 30, respectively, and the second terminals of the other two half-wave light emitting cells 70a and 70b disposed between the two light emitting cells 30 may be connected to the wire 77b. As the number of half-wave light emitting cells 30 disposed in one row is controlled, the wires 37b and 77b connect half-wave light emitting cells 30 in the same order or in a different order.

Although it has been described in the seventh exemplary embodiment that the bonding pads 71 and 73 are positioned between the uppermost and lowermost rows of half-wave light emitting cells 30, the present invention is not limited thereto. That is, the bonding pads may be disposed in various shapes and at various positions. The bonding pads 71 and 73 may also be formed on two of the half-wave light emitting cells 30, whereby the wires 37c can be omitted.

Figure 21:
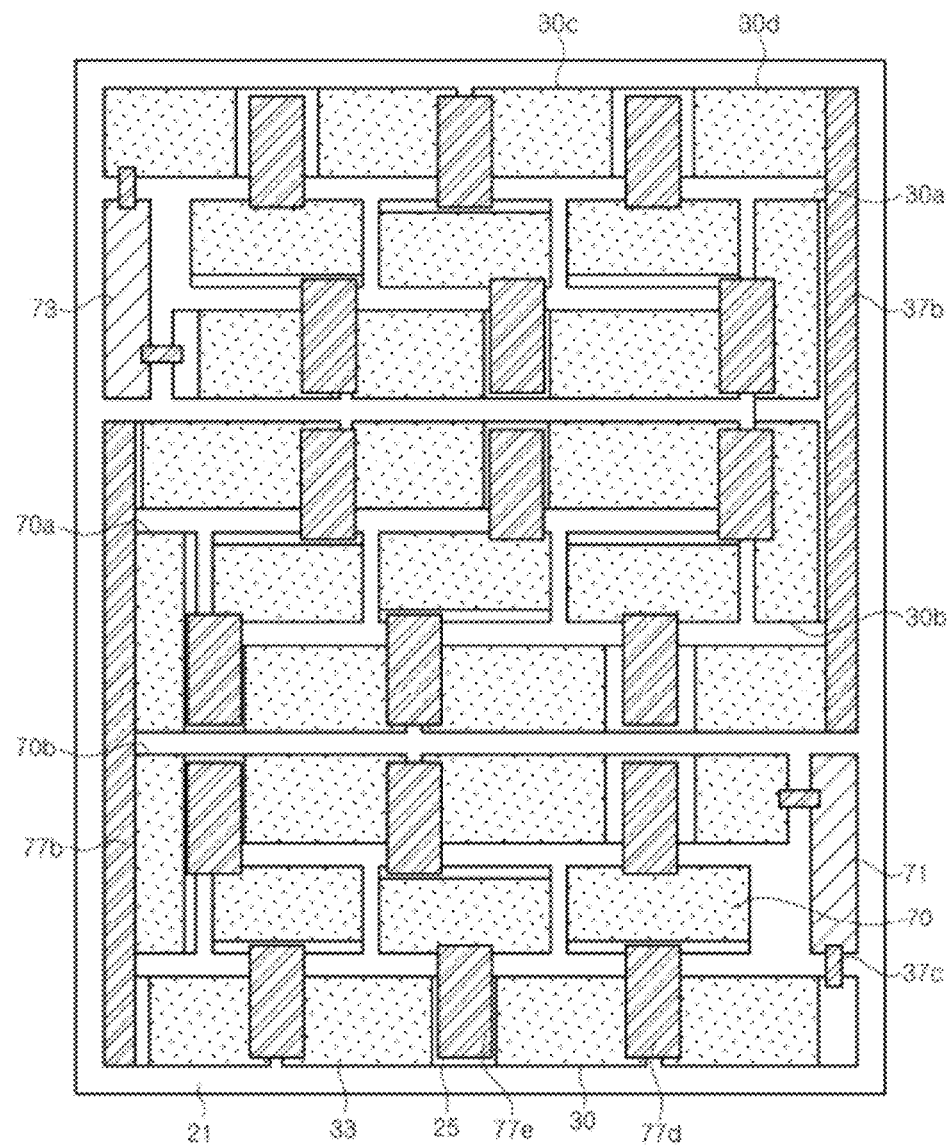
FIG. 21 is a plan view of an LED according to an eighth exemplary embodiment of the present invention.

FIG. 21 is a plan view illustrating an LED according to an eighth exemplary embodiment of the present invention. An equivalent circuit of the LED according to the eighth exemplary embodiment is identical to that illustrated in FIG. 20.

Referring to FIG. 21, the LED according to the eighth exemplary embodiment is roughly similar to that described in the seventh exemplary embodiment with reference to FIG. 19, but is different therefrom in that light emitting cells 30c and 30d with second terminals facing each other are share a first conductive-type semiconductor layer 25. The half-wave light emitting cells 30a and 30b connected to a wire 37b also share a first conductive-type semiconductor layer 25.

Accordingly, steps formed to separate light emitting cells 30 from each other may be reduced, so that wires 37b, 77d, and 77e may be easily formed and their wiring reliability may be improved.

Figure 22:
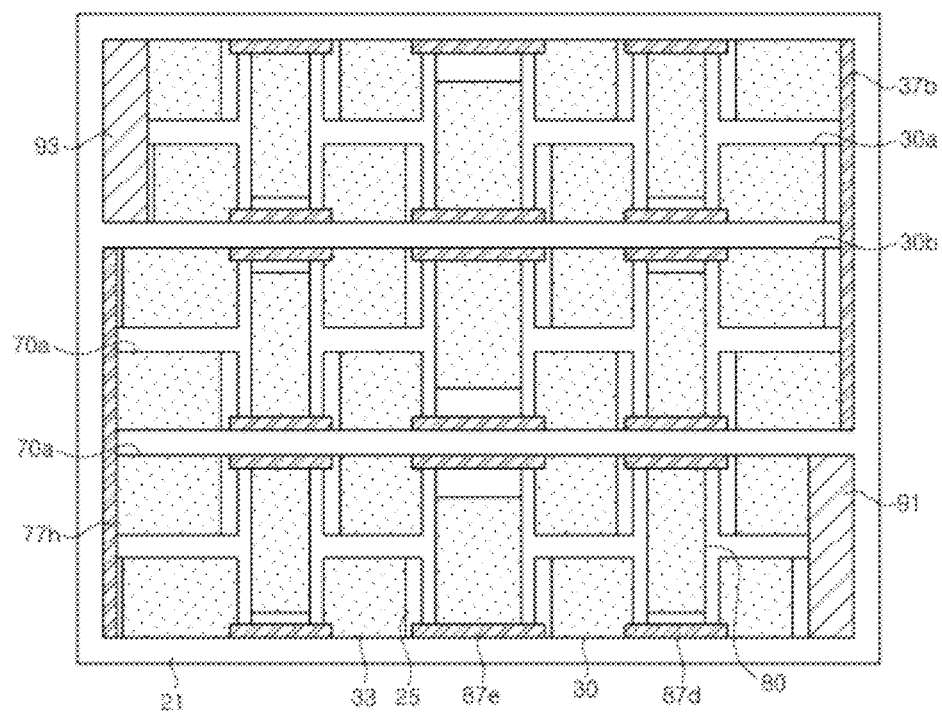
FIG. 22 is a plan view of an LED according to a ninth exemplary embodiment of the present invention.

FIG. 22 is a plan view illustrating an LED according to a ninth exemplary embodiment of the present invention. An equivalent circuit of the LED according to the ninth exemplary embodiment is identical to that illustrated in FIG. 20.

Referring to FIG. 22, the LED comprises a substrate 21, bonding pads 91 and 93, a plurality of half-wave light emitting cells 30, a plurality of full-wave light emitting cells 80, and wires 37b, 77b, 87e, and 87d.

The substrate 21 and the half-wave light emitting cells 30 are similar to those described in the second exemplary embodiment with reference to FIG. 12 and FIG. 13. However, in the ninth exemplary embodiment, light emitting cells 30 in one row are disposed to face each other. That is, light emitting cells 30c and 30d are disposed such that their first terminals or second terminals face each other.

Meanwhile, the full-wave light emitting cells 80 are disposed between the half-wave light emitting cells 30 that face each other and disposed over two rows of the half-wave light emitting cells 30. The fourth terminal of each full-wave light emitting cell 80 is electrically connected to the first terminals of two of the half-wave light emitting cells 30 through the wire 87d, and the third terminal of each full-wave light emitting cell 80 is electrically connected to the second terminals of two of the half-wave light emitting cells 30 through the wire 87e. Each of the wires 87d and 87e sequentially connects two of the half-wave light emitting cells 30 and one of the full-wave light emitting cells 80. One of the half-wave light emitting cells 30 is disposed in a forward direction between the third terminal of one of the full-wave light emitting cells 80 and the fourth terminal of another adjacent one of the full-wave light emitting cells 80, and one of the half-wave light emitting cells 30 is disposed in a forward direction between the fourth terminal of one of the one full-wave light emitting cells 80 and the third terminal of another adjacent one of the full-wave light emitting cells 80.

Accordingly, the ninth exemplary embodiment provides an LED having an equivalent circuit identical to that illustrated in FIG. 20.

Although the ninth exemplary embodiment discloses that one of the full-wave light emitting cells 80 is disposed between rows of the half-wave light emitting cells 30, a plurality of full-wave light emitting cells 80 in an array form may be disposed between the rows of the half-wave light emitting cells 30. Further, a plurality of half-wave light emitting cells 30 in an array form may be disposed between adjacent full-wave light emitting cells 80. However, the number of half-wave or full-wave light emitting cells 30 and 80 that may be arranged in an array form is limited in consideration of reverse voltage applied to the half-wave light emitting cells 30.

Meanwhile, as described in the seventh exemplary embodiment with reference to FIG. 19, each of the wires 37b and 77b electrically connects four of the light emitting cells.

In the ninth exemplary embodiment, each of the bonding pads 91 and 93 is formed on two of the half-wave light emitting cells 30 and electrically connected to them. Therefore, the wires 37c illustrated in FIG. 19 may be omitted.

Figure 23:
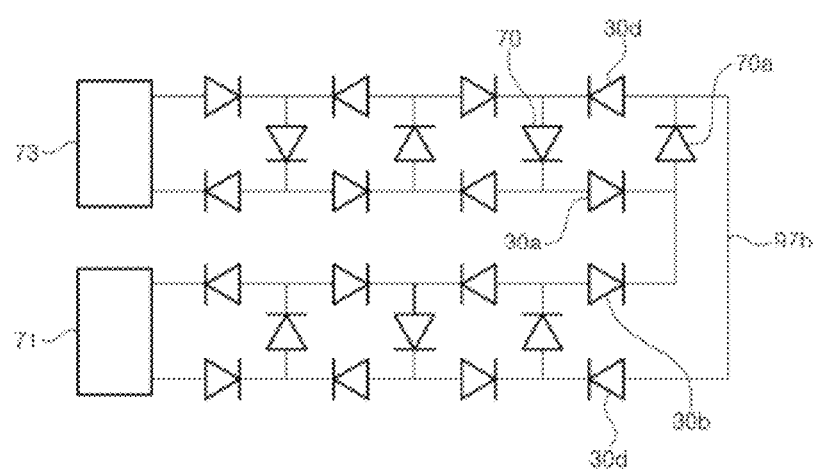
FIG. 23 and FIG. 24 are respectively an equivalent circuit diagram and a plan view illustrating an LED according to a tenth exemplary embodiment of the present invention.
Figure 24:
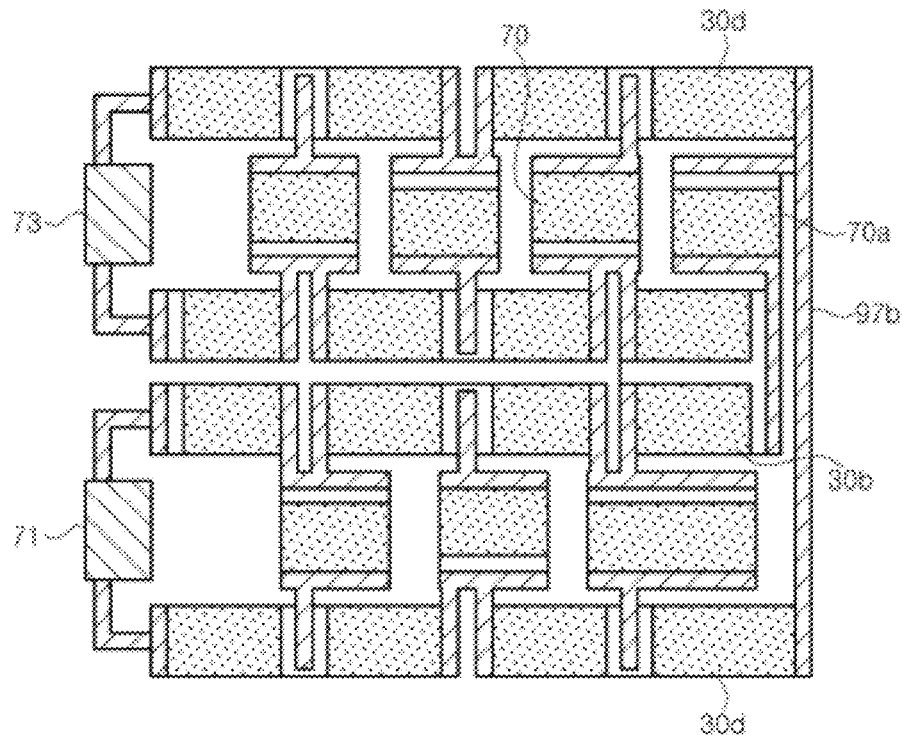

FIG. 23 and FIG. 24 respectively illustrate an equivalent circuit diagram and a plan view of an LED according to a tenth exemplary embodiment of the present invention.

Referring to FIG. 23 and FIG. 24, in the LED according to the tenth exemplary embodiment, half-wave light emitting cells are arranged in four rows between bonding pads 71 and 73, and each of two rows of full-wave light emitting cells are arranged between two rows of half-wave light emitting cells, as compared with the LED described in the seventh, eighth, or ninth exemplary embodiments with reference to FIG. 20.

In the circuit diagram illustrated in FIG. 20, two rows of half-wave light emitting cells 30 arranged in an upper portion of FIG. 20 and two rows of half-wave light emitting cells 30 arranged in a lower portion thereof are electrically connected to each other through the wire 37b. In such an arrangement, the half-wave light emitting cell 30d positioned at the right end of the first row and the half-wave light emitting cell 30a positioned at the right end of the second row are connected directly to the half-wave light emitting cell 30b positioned at the right end of the third row and the half-wave light emitting cell 30d positioned at the right end of the fourth row through the wire 37b.

The LED according to the tenth exemplary embodiment further comprises an additional full-wave light emitting cell 70a positioned between the half-wave light emitting cell 30d positioned at the right end of the first row and the half-wave light emitting cell 30a positioned at the right end of the second row. Also, the second terminals of the half-wave light emitting cell 30a positioned at the right end of the second row and the half-wave light emitting cell 30b positioned at the right end of the third row are electrically connected to each other, and the half-wave light emitting cell 30d positioned at the right end of the first row and the half-wave light emitting cell 30d positioned at the right end of the fourth row are connected to each other through a wire 97b. The half-wave light emitting cells 30a and 30b are connected to the half-wave light emitting cells 30d of the first and fourth row through the full-wave light emitting cell 70a.

The tenth exemplary embodiment provides an LED in which the same basic structure of light emitting cells is repeated so that forward current alternately flows through the half-wave light emitting cells and the full-wave light emitting cells, which makes it possible to increase the number of full-wave light emitting cells as compared with the aforementioned exemplary embodiments.

Figure 25:
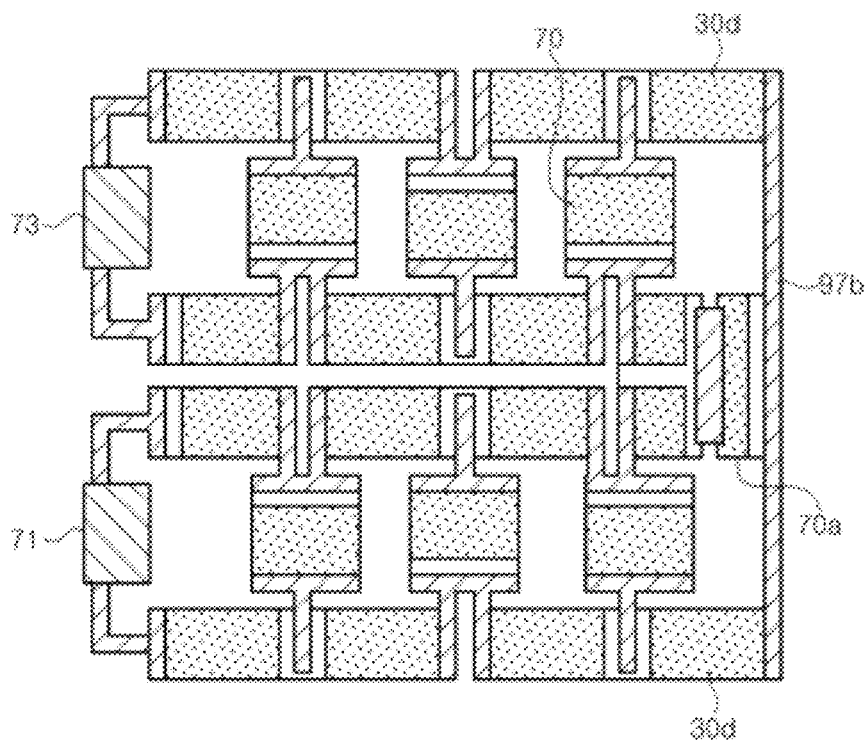
FIG. 25 is a plan view illustrating an LED according to an eleventh exemplary embodiment of the present invention.

The position of the additional full-wave light emitting cell 70a is not particularly limited, but may be disposed parallel in the row of upper full-wave light emitting cells 70 as shown in FIG. 24 or disposed parallel in the row of lower full-wave light emitting cells 70. Alternatively, the additional full-wave light emitting cell 70a may be disposed at the right side of the region between the second and third rows of half-wave light emitting cells as shown in FIG. 25.

As shown in FIG. 24, the first terminal of the half-wave light emitting cell 30d positioned at the right end of the first row and the first terminal of the half wave light emitting cell 30d positioned at the right end of the fourth row may be connected to each other through the wire 97*b*. However, the present invention is not limited thereto. That is, the second terminal of the half-wave light emitting cell 30*d* positioned at the right end of the first row and the second terminal of the half-wave light emitting cell 30*d* positioned at the right end of the fourth row may be connected to each other through the wire 97*b*, depending on the number of the half-wave light emitting cells in each row.

Figure 26:
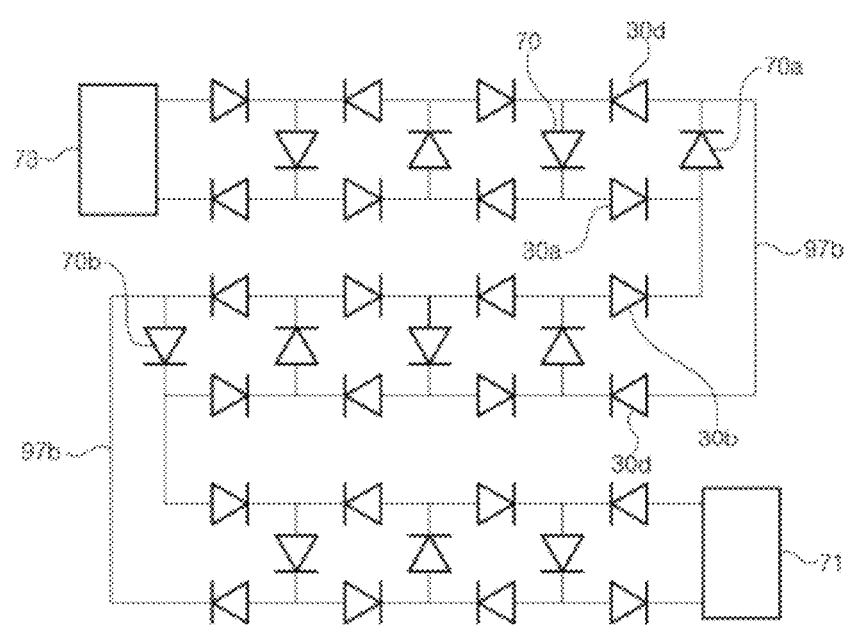
FIG. 26 and FIG. 27 are respectively an equivalent circuit diagram and a plan view illustrating an LED according to a twelfth exemplary embodiment of the present invention.
Figure 27:
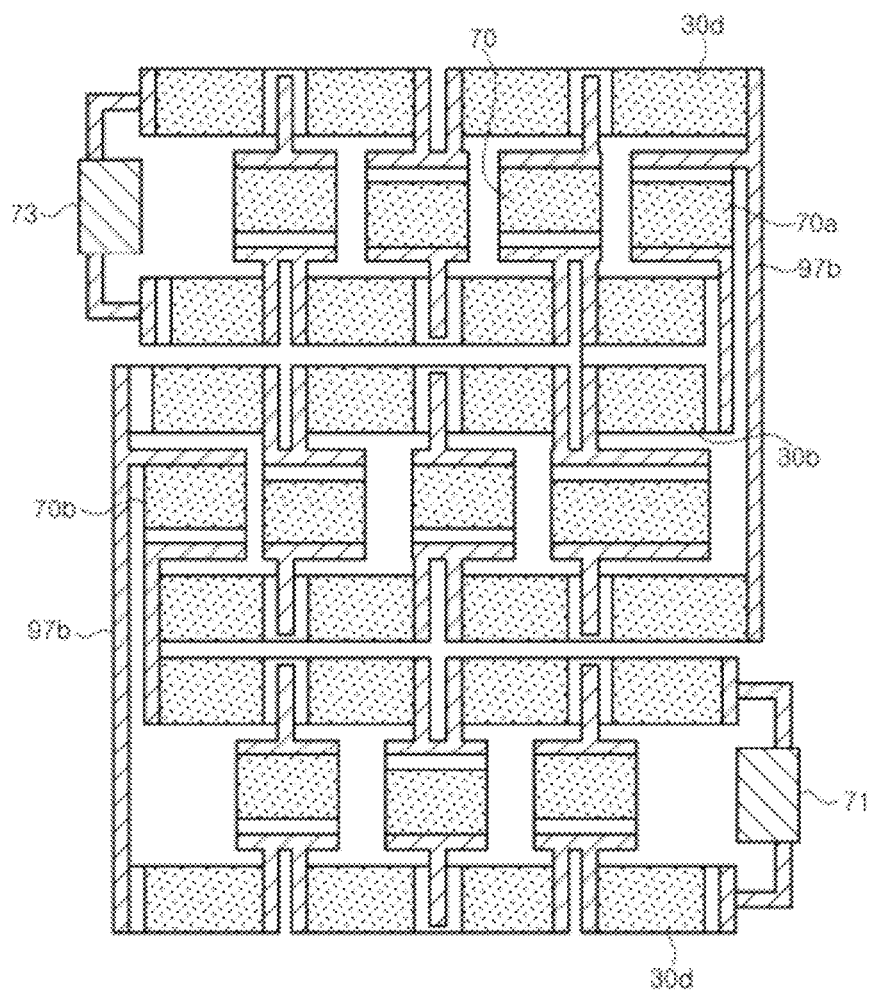

FIG. 26 and FIG. 27 are respectively an equivalent circuit diagram and a plan view illustrating an LED according to an eleventh exemplary embodiment of the present invention.

Referring to FIG. 26 and FIG. 27, in the LED according to the eleventh exemplary embodiment, half-wave light emitting cells are arranged in six rows between bonding pads 71 and 73, and three rows of full-wave light emitting cells 70 are each arranged between two rows of full-wave light emitting cells, similarly to the LED described in the seventh, eighth, and ninth exemplary embodiments with reference to FIG. 20. As described with reference to FIG. 23 and FIG. 24, an additional full-wave light emitting cell 70*a* is used to connect the half-wave light emitting cells positioned at the right ends of the first and second rows and the half-wave light emitting cells positioned at the right ends of the third and fourth rows.

In the eleventh exemplary embodiment, an additional full-wave light emitting cell 70*b* is used to connect the half-wave light emitting cells positioned at the left ends of the third and fourth rows to the half-wave light emitting cells positioned at the left ends of the fifth and sixth rows.

By using the additional full-wave light emitting cells 70*a* and 70*b*, an LED is provided in which the same basic structure of light emitting cells is repeated even though light emitting cells are arranged in a greater number of rows.

Figure 28:
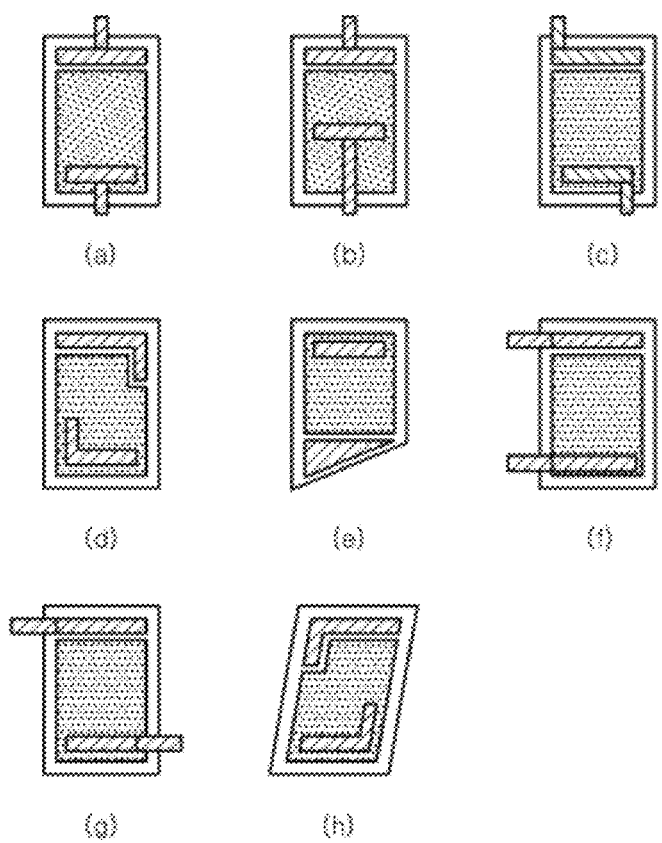
FIG. 28 shows plan views illustrating various arrangement of electrodes and shapes of light emitting cells used in an LED according to exemplary embodiments of the present invention.

FIG. 28 shows plan views illustrating various arrangement of electrodes and shapes of light emitting cells used in an LED according to exemplary embodiments of the present invention. FIG. 28 shows that electrodes are connected to wires, but the wires and electrodes may be formed together in the same process.

Referring to FIG. 28(*a*), electrodes, e.g., an n-electrode and a p-electrode are respectively formed on a first conductive-type lower semiconductor layer and a second conductive-type upper semiconductor layer of a light emitting cell. Each of the electrodes comprises an extension extending from a portion at which a wire is connected to the electrode. The extensions of the n-electrode and p-electrode may be formed to be symmetric and parallel with each other. The wires may be connected to central portions of the corresponding electrodes, respectively.

Referring to FIG. 28(*b*), electrodes (an n-electrode and a p-electrode) are respectively formed on a first conductive-type lower semiconductor layer and a second conductive upper semiconductor layer of a light emitting cell. The electrode formed on the second conductive upper semiconductor layer, e.g., the p-electrode, may be formed at a central portion on a light emitting region. Each of the electrodes may be formed to have an extension as described with FIG. 28(*a*).

Referring to FIG. 28(*c*), which is similar to the light emitting cell shown in FIG. 28(*a*), has wires connected to electrodes in the vicinity of corners of a first conductive-type lower semiconductor layer and a second conductive upper semiconductor layer, respectively. The wires are connected to the electrodes at diagonally symmetric portions of the light emitting cell. Each of the electrodes has an extension extending along an edge of the light emitting cell from the portion at which the wire is connected to the electrode. The extensions may be formed parallel with each other, so that the distance between the extensions is substantially identical.

Referring to FIG. 28(*d*), electrodes are formed on a first conductive-type lower semiconductor layer and a second conductive upper semiconductor layer of a light emitting cell, respectively. The electrodes are positioned to be diagonally symmetric with each other. Each of the electrodes may have an extension, and the extensions may be formed along portions of edges of the light emitting cell. The corresponding extensions of an n-electrode and a p-electrode may be parallel with each other. Also, the extensions are positioned to be symmetric and diagonally parallel with each other on the light emitting cell.

Referring to FIG. 28(*e*), a light emitting cell may have a trapezoid shape. In this case, one of electrodes may have a triangular shape. For example, when a light emitting region has a rectangular shape as shown in this figure, an n-electrode may have a triangular shape. Alternatively, when the light emitting region has a trapezoid shape, a p-electrode may have a triangular shape.

Referring to FIG. 28(*f*), wires may be connected to electrodes at the same side of a light emitting cell. The electrodes may have extensions extending along edges of a first conductive-type lower semiconductor layer and a second conductive upper semiconductor layer from portions at which the wires are connected to the electrodes, respectively. The extensions may be parallel with each other.

Referring to FIG. 28(*g*), wires may be connected to electrodes at opposite sides of a light emitting cell, respectively. The electrodes may have extensions extending along edges of a first conductive-type lower semiconductor layer and a second conductive upper semiconductor layer from portions at which the wires are connected to the electrodes, respectively. The extensions may be parallel with each other.

Referring to FIG. 28(*h*), a light emitting cell may have a parallelogram shape. Electrodes may have a plurality of extensions extending in the vicinity of corners, respectively. The extensions may extend along edges of the light emitting cell, respectively. The corresponding extensions of an n-electrode and a p-electrode may be formed to be parallel with each other.

As described above, although the structure of light emitting cells and the connection of light emitting cells through wires have been schematically described, various modifications may be made to the structure of light emitting cells and wires. Each n-electrode and p-electrode may comprise more than one extension, for instance.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED), comprising:
   a plurality of light emitting cells arranged on a substrate;
   a light emitting cell of the plurality of light emitting cells comprising a first semiconductor layer, a second semiconductor layer, and a first insulating layer comprising a plurality of openings, wherein the openings expose the first semiconductor layer and the second semiconductor layer; and
   a plurality of conductors to electrically connect the light emitting cells via the plurality of openings,
   wherein a conductor electrically connects at least four light emitting cells, the conductor to electrically connect the first semiconductor layers of two of the four light emitting cells to the second semiconductor layers of the other two of the four light emitting cells.

2. The LED of claim 1, wherein the two light emitting cells are arranged between the other two light emitting cells.

3. The LED of claim 2, wherein the two light emitting cells share a first semiconductor layer.

4. The LED of claim 1, wherein the first semiconductor layer and the second semiconductor layer comprise an inclined sidewall.

5. The LED of claim 4, wherein the inclined sidewall comprises two slopes.

6. The LED of claim 5, wherein a boundary of the two slopes is positioned in the first semiconductor layer.

7. The LED of claim 1, further comprising a second insulating layer to cover the conductor.

8. The LED of claim 7, wherein the first insulating layer is thicker than the second insulating layer.

9. The LED of claim 1, wherein the plurality of light emitting cells comprises at least one full-wave light emitting cell and at least two half-wave light emitting cells.

10. The LED of claim 9, wherein the plurality of conductors comprises a conductor to electrically connect the second semiconductor layer of one full-wave light emitting cell to first semiconductor layers of two half-wave light emitting cells.

11. The LED of claim 10, wherein the two half-wave light emitting cells share the first semiconductor layer.

12. The LED of claim 10, wherein the plurality of conductors comprises a conductor to electrically connect the first semiconductor layer of one the full-wave light emitting cell to the second semiconductor layers of two half-wave light emitting cells.

13. The LED of claim 12, wherein the conductor is arranged along an edge of one side of the substrate and arranged adjacent to a first corner the substrate;
wherein another conductor is arranged along an edge of another side of the substrate and arranged adjacent to a second corner of the substrate diagonally opposite to the first corner; and
wherein the one side of the substrate and the other side of the substrate face each other.

14. The LED of claim 1, wherein the conductor is arranged along an edge of the substrate.

15. The LED of claim 1, wherein each light emitting cell comprises an n-electrode and a p-electrode, and at least one of the light emitting cells further comprises an n-electrode extension or a p-electrode extension.

16. The LED of claim 15, wherein the at least one light emitting cell further comprises an n-electrode extension and a p-electrode extension, and the n-electrode extension and the p-electrode extension are symmetric.

17. The LED of claim 16, wherein the n-electrode extension and the p-electrode extension are parallel.

18. The LED of claim 16, wherein the n-electrode extension and the p-electrode extension are diagonally symmetric.

19. The LED of claim 16, wherein each light emitting cell comprises an n-electrode extension and a p-electrode extension, and
wherein a distance between each n-electrode extension is substantially the same, and a distance between each p-electrode extension is substantially the same.

* * * * *